(12) United States Patent
Zheng

(10) Patent No.: US 9,190,609 B2
(45) Date of Patent: *Nov. 17, 2015

(54) GERMANIUM ANTIMONY TELLURIDE MATERIALS AND DEVICES INCORPORATING SAME

(75) Inventor: Jun-Fei Zheng, Westport, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/698,642

(22) PCT Filed: May 21, 2011

(86) PCT No.: PCT/US2011/037479
§ 371 (c)(1),
(2), (4) Date: Jan. 9, 2013

(87) PCT Pub. No.: WO2011/146913
PCT Pub. Date: Nov. 24, 2011

(65) Prior Publication Data
US 2013/0112933 A1   May 9, 2013

Related U.S. Application Data

(60) Provisional application No. 61/379,386, filed on Sep. 1, 2010, provisional application No. 61/379,381, filed on Sep. 1, 2010, provisional application No. 61/378,385, filed on Aug. 30, 2010, provisional application No. 61/365,744, filed on Jul. 19, 2010, provisional application No. 61/347,347, filed on May 21, 2010.

(51) Int. Cl.
*H01L 45/00* (2006.01)
*C22C 28/00* (2006.01)
*C23C 16/30* (2006.01)

(52) U.S. Cl.
CPC ............. *H01L 45/065* (2013.01); *C22C 28/00* (2013.01); *C23C 16/305* (2013.01); *H01L 45/06* (2013.01); *H01L 45/144* (2013.01); *H01L 45/1608* (2013.01); *H01L 45/1683* (2013.01)

(58) Field of Classification Search
CPC ..... H01L 45/06; H01L 45/065; H01L 45/144; H01L 45/1683
USPC .......................... 438/102; 257/3, 4, E45.002
See application file for complete search history.

(56) References Cited

U.S. PATENT DOCUMENTS 3,467,686 A   9/1969   Creamer
4,383,119 A   5/1983   Pullukat et al.
(Continued)

FOREIGN PATENT DOCUMENTS

EP   1466918 A1   10/2004
EP   1675194 A2    6/2006
(Continued)

OTHER PUBLICATIONS

Abrutis, A., et al., "Hot-Wire Chemical Vapor Deposition of Chalcogenide Materials for Phase Change Memory Applications", "Chem. Mater.", May 2008, pp. 3557-3559, vol. 20, No. 11.
(Continued)

*Primary Examiner* — Joseph C Nicely
(74) *Attorney, Agent, or Firm* — Hultquist, PLLC; Steven J. Hultquist; Maggie Chappuis

(57) ABSTRACT

A chalcogenide alloy composition, having an atomic composition comprising from 34 to 45 Ge, from 2 to 16% Sb, from 48 to 55% Te, from 3 to 15% carbon and from 1 to 10% nitrogen, wherein all atomic percentages of all components of the film total to 100 atomic %. Material of such composition is useful to form phase change films, e.g., as conformally coated on a phase change memory device substrate to fabricate a phase change random access memory cell.

20 Claims, 12 Drawing Sheets

(56) References Cited

U.S. PATENT DOCUMENTS

| | | |
|---|---|---|
| 4,491,669 A | 1/1985 | Arkles et al. |
| 4,499,198 A | 2/1985 | Pullukat et al. |
| 4,895,709 A | 1/1990 | Laine |
| 4,927,670 A | 5/1990 | Erbil |
| 4,948,623 A | 8/1990 | Beach et al. |
| 4,960,916 A | 10/1990 | Pazik |
| 4,962,214 A | 10/1990 | Villacorta et al. |
| 5,003,092 A | 3/1991 | Beachley, Jr. |
| 5,008,422 A | 4/1991 | Blum et al. |
| 5,084,588 A | 1/1992 | Ocheltree et al. |
| 5,139,825 A | 8/1992 | Gordon et al. |
| 5,178,911 A | 1/1993 | Gordon et al. |
| 5,210,254 A | 5/1993 | Ritscher et al. |
| 5,225,561 A | 7/1993 | Kirlin et al. |
| 5,268,496 A | 12/1993 | Geisberger |
| 5,312,983 A | 5/1994 | Brown et al. |
| 5,417,823 A | 5/1995 | Narula et al. |
| 5,442,200 A | 8/1995 | Tischler |
| 5,453,494 A | 9/1995 | Kirlin et al. |
| 5,566,045 A | 10/1996 | Summerfelt et al. |
| 5,576,928 A | 11/1996 | Summerfelt et al. |
| 5,583,205 A | 12/1996 | Rees, Jr. |
| 5,596,522 A * | 1/1997 | Ovshinsky et al. ............ 365/113 |
| 5,653,806 A | 8/1997 | Van Buskirk |
| 5,687,112 A | 11/1997 | Ovshinsky |
| 5,698,726 A | 12/1997 | Rauleder et al. |
| 5,719,417 A | 2/1998 | Roeder et al. |
| 5,726,294 A | 3/1998 | Rees, Jr. |
| 5,820,664 A | 10/1998 | Gardiner et al. |
| 5,919,522 A | 7/1999 | Baum et al. |
| 5,976,991 A | 11/1999 | Laxman et al. |
| 5,980,265 A | 11/1999 | Tischler |
| 5,998,236 A | 12/1999 | Roeder et al. |
| 6,005,127 A | 12/1999 | Todd et al. |
| 6,015,917 A | 1/2000 | Bhandari et al. |
| 6,086,779 A | 7/2000 | Bishop et al. |
| 6,133,051 A | 10/2000 | Hintermaier et al. |
| 6,146,608 A | 11/2000 | Todd et al. |
| 6,269,979 B1 | 8/2001 | Dumont |
| 6,281,022 B1 | 8/2001 | Li et al. |
| 6,319,565 B1 | 11/2001 | Todd et al. |
| 6,399,208 B1 | 6/2002 | Baum et al. |
| 6,506,666 B2 | 1/2003 | Marsh |
| 6,511,718 B1 | 1/2003 | Paz de Araujo et al. |
| 6,646,122 B1 | 11/2003 | Nuhlen et al. |
| 6,716,271 B1 | 4/2004 | Arno et al. |
| 6,750,079 B2 | 6/2004 | Lowrey et al. |
| 6,767,830 B2 | 7/2004 | Wang et al. |
| 6,787,186 B1 | 9/2004 | Hintermaier |
| 6,861,559 B2 | 3/2005 | Odom |
| 6,869,638 B2 | 3/2005 | Baum et al. |
| 6,872,963 B2 | 3/2005 | Kostylev et al. |
| 6,916,944 B2 | 7/2005 | Furukawa et al. |
| 6,984,591 B1 | 1/2006 | Buchanan et al. |
| 6,998,289 B2 | 2/2006 | Hudgens et al. |
| 7,005,303 B2 | 2/2006 | Hintermaier et al. |
| 7,029,978 B2 | 4/2006 | Dodge |
| 7,087,482 B2 | 8/2006 | Yeo et al. |
| 7,114,517 B2 | 10/2006 | Sund et al. |
| 7,115,927 B2 | 10/2006 | Hideki et al. |
| 7,312,165 B2 | 12/2007 | Jursich et al. |
| 7,371,429 B2 | 5/2008 | Lee et al. |
| 7,397,060 B2 | 7/2008 | Lung |
| 7,399,666 B2 | 7/2008 | Ahn et al. |
| 7,402,851 B2 | 7/2008 | Hideki et al. |
| 7,419,698 B2 | 9/2008 | Jones |
| 7,425,735 B2 | 9/2008 | Park et al. |
| 7,462,900 B2 | 12/2008 | Hideki et al. |
| 7,476,917 B2 | 1/2009 | Hideki et al. |
| 7,488,967 B2 | 2/2009 | Burr et al. |
| 7,525,117 B2 | 4/2009 | Kostylev et al. |
| 7,569,417 B2 | 8/2009 | Lee et al. |
| 7,615,401 B2 | 11/2009 | Park et al. |
| 7,632,456 B2 | 12/2009 | Cheong et al. |
| 7,704,787 B2 | 4/2010 | Hideki et al. |
| 7,728,172 B2 | 6/2010 | Lee et al. |
| 7,791,932 B2 | 9/2010 | Kuh et al. |
| 7,838,329 B2 | 11/2010 | Hunks et al. |
| 7,943,502 B2 | 5/2011 | Park et al. |
| 7,943,923 B2 | 5/2011 | Gidon |
| 8,008,117 B2 | 8/2011 | Hunks et al. |
| 8,192,592 B2 | 6/2012 | Kim et al. |
| 8,272,347 B2 | 9/2012 | Nasman et al. |
| 8,330,136 B2 | 12/2012 | Zheng et al. |
| 8,410,468 B2 * | 4/2013 | Zheng ............... 257/2 |
| 8,445,354 B2 | 5/2013 | Ha et al. |
| 9,012,876 B2 * | 4/2015 | Zheng ............... 257/2 |
| 2002/0004266 A1 | 1/2002 | Hashimoto et al. |
| 2002/0090815 A1 | 7/2002 | Koike et al. |
| 2003/0135061 A1 | 7/2003 | Norman et al. |
| 2004/0012009 A1 | 1/2004 | Casagrande et al. |
| 2004/0038808 A1 | 2/2004 | Hampden-Smith et al. |
| 2004/0087074 A1 * | 5/2004 | Hwang et al. ............ 438/198 |
| 2004/0197945 A1 | 10/2004 | Woelk et al. |
| 2004/0215030 A1 | 10/2004 | Norman |
| 2005/0029502 A1 | 2/2005 | Hudgens |
| 2005/0064334 A1 * | 3/2005 | Hirotsune et al. ........ 430/270.13 |
| 2005/0082624 A1 | 4/2005 | Gousev et al. |
| 2005/0208699 A1 | 9/2005 | Furkay et al. |
| 2005/0267345 A1 | 12/2005 | Korgel et al. |
| 2005/0283012 A1 | 12/2005 | Xu et al. |
| 2005/0287747 A1 | 12/2005 | Chakravarti et al. |
| 2006/0006449 A1 | 1/2006 | Jeong et al. |
| 2006/0024429 A1 * | 2/2006 | Horii ............... 427/97.7 |
| 2006/0027451 A1 | 2/2006 | Park et al. |
| 2006/0035462 A1 | 2/2006 | Millward |
| 2006/0046521 A1 | 3/2006 | Vaartstra et al. |
| 2006/0049447 A1 | 3/2006 | Lee et al. |
| 2006/0054878 A1 * | 3/2006 | Lowrey ............... 257/3 |
| 2006/0105556 A1 * | 5/2006 | Matsui et al. ............ 438/584 |
| 2006/0113520 A1 * | 6/2006 | Yamamoto et al. ............... 257/3 |
| 2006/0115595 A1 | 6/2006 | Shenai-Khatkhate et al. |
| 2006/0138393 A1 * | 6/2006 | Seo et al. ............ 257/2 |
| 2006/0141155 A1 | 6/2006 | Gordon et al. |
| 2006/0141710 A1 | 6/2006 | Yoon et al. |
| 2006/0172067 A1 | 8/2006 | Ovshinsky et al. |
| 2006/0172083 A1 | 8/2006 | Lee et al. |
| 2006/0180811 A1 | 8/2006 | Lee et al. |
| 2007/0025226 A1 * | 2/2007 | Park et al. ............ 369/100 |
| 2007/0090336 A1 * | 4/2007 | Asano et al. ............ 257/3 |
| 2007/0120104 A1 * | 5/2007 | Ahn et al. ............ 257/2 |
| 2007/0121363 A1 | 5/2007 | Lung |
| 2007/0154637 A1 | 7/2007 | Shenai-Khatkhate et al. |
| 2007/0160760 A1 | 7/2007 | Shin et al. |
| 2007/0246748 A1 | 10/2007 | Breitwisch et al. |
| 2007/0252127 A1 * | 11/2007 | Arnold et al. ............ 257/2 |
| 2008/0003359 A1 | 1/2008 | Gordon et al. |
| 2008/0035906 A1 | 2/2008 | Park et al. |
| 2008/0035961 A1 | 2/2008 | Chen et al. |
| 2008/0067490 A1 * | 3/2008 | Hayakawa ............ 257/4 |
| 2008/0078984 A1 | 4/2008 | Park et al. |
| 2008/0099791 A1 * | 5/2008 | Lung ............... 257/213 |
| 2008/0118636 A1 * | 5/2008 | Shin et al. ............ 427/124 |
| 2008/0164453 A1 * | 7/2008 | Breitwisch et al. ............... 257/3 |
| 2008/0169457 A1 | 7/2008 | Hideki et al. |
| 2008/0210163 A1 | 9/2008 | Carlson et al. |
| 2008/0254218 A1 | 10/2008 | Lei et al. |
| 2008/0254232 A1 | 10/2008 | Gordon et al. |
| 2008/0258127 A1 | 10/2008 | Lee et al. |
| 2008/0290335 A1 | 11/2008 | Lin et al. |
| 2009/0020738 A1 | 1/2009 | Happ et al. |
| 2009/0075420 A1 | 3/2009 | Bae et al. |
| 2009/0087561 A1 | 4/2009 | Chen et al. |
| 2009/0097305 A1 | 4/2009 | Bae et al. |
| 2009/0101883 A1 | 4/2009 | Lai et al. |
| 2009/0112009 A1 | 4/2009 | Chen et al. |
| 2009/0124039 A1 | 5/2009 | Roeder et al. |
| 2009/0215225 A1 | 8/2009 | Stender et al. |
| 2009/0227066 A1 | 9/2009 | Joseph et al. |
| 2009/0250682 A1 * | 10/2009 | Park et al. ............ 257/4 |
| 2009/0275164 A1 | 11/2009 | Chen et al. |
| 2009/0291208 A1 | 11/2009 | Gordon et al. |
| 2009/0298223 A1 | 12/2009 | Cheek et al. |
| 2009/0302297 A1 * | 12/2009 | Park et al. ............ 257/3 |

(56) References Cited

U.S. PATENT DOCUMENTS

| | | |
|---|---|---|
| 2009/0305458 A1 | 12/2009 | Hunks et al. |
| 2009/0321706 A1* | 12/2009 | Happ et al. ............... 257/4 |
| 2009/0321733 A1 | 12/2009 | Gatineau et al. |
| 2010/0012917 A1 | 1/2010 | Takaura et al. |
| 2010/0018439 A1 | 1/2010 | Cameron et al. |
| 2010/0054029 A1 | 3/2010 | Happ et al. |
| 2010/0059731 A1* | 3/2010 | Chang ............... 257/3 |
| 2010/0081263 A1* | 4/2010 | Horii et al. ............ 438/479 |
| 2010/0112211 A1 | 5/2010 | Xu et al. |
| 2010/0112795 A1 | 5/2010 | Kaim et al. |
| 2010/0116990 A1* | 5/2010 | Xu et al. ............ 250/339.06 |
| 2010/0130013 A1* | 5/2010 | Liu et al. ............ 438/693 |
| 2010/0164057 A1 | 7/2010 | Hunks et al. |
| 2010/0190341 A1 | 7/2010 | Park et al. |
| 2010/0209610 A1 | 8/2010 | Cameron et al. |
| 2010/0270527 A1 | 10/2010 | Sawamura |
| 2010/0317150 A1 | 12/2010 | Hunks et al. |
| 2011/0001107 A1* | 1/2011 | Zheng ............... 257/2 |
| 2011/0006279 A1* | 1/2011 | Chen ............... 257/5 |
| 2011/0060165 A1 | 3/2011 | Cameron et al. |
| 2011/0065252 A1 | 3/2011 | Nakamura |
| 2011/0111556 A1 | 5/2011 | Chen et al. |
| 2011/0124182 A1 | 5/2011 | Zheng |
| 2011/0136316 A1* | 6/2011 | Chang ............... 438/382 |
| 2011/0198555 A1* | 8/2011 | Kikuchi et al. ............ 257/3 |
| 2011/0212568 A1* | 9/2011 | Shin ............... 438/102 |
| 2011/0227021 A1 | 9/2011 | Schrott et al. |
| 2011/0227029 A1* | 9/2011 | Liu ............... 257/4 |
| 2011/0260132 A1* | 10/2011 | Zheng et al. ............ 257/2 |
| 2011/0263100 A1 | 10/2011 | Hunks et al. |
| 2012/0032135 A1* | 2/2012 | Kuh et al. ............ 257/4 |
| 2012/0115315 A1* | 5/2012 | Zheng ............... 438/483 |
| 2012/0134204 A1* | 5/2012 | Happ et al. ............ 365/163 |
| 2012/0171812 A1* | 7/2012 | Marsh ............... 438/102 |
| 2013/0078475 A1* | 3/2013 | Zheng ............... 428/457 |
| 2013/0112933 A1 | 5/2013 | Zheng |
| 2013/0241037 A1* | 9/2013 | Jeong et al. ............ 257/536 |

FOREIGN PATENT DOCUMENTS

| | | | |
|---|---|---|---|
| EP | 1806427 A2 | 7/2007 | |
| JP | 58-38296 A | 3/1983 | |
| JP | 5-311423 A | 11/1993 | |
| JP | 6-80413 A | 3/1994 | |
| JP | 6-293778 A | 10/1994 | |
| JP | 7-263431 A | 10/1995 | |
| JP | 8-74055 A | 3/1996 | |
| JP | 2000215510 A * | 8/2000 | G11B 7/24 |
| JP | 2001-67720 A | 3/2001 | |
| JP | 2002-211924 A | 7/2002 | |
| JP | 2002-220658 A | 8/2002 | |
| JP | 2006-511716 A | 4/2006 | |
| JP | 2006-124262 A | 5/2006 | |
| JP | 2006-182781 A | 7/2006 | |
| JP | 2008-252088 A | 10/2008 | |
| JP | 2011-66135 A | 3/2011 | |
| KR | 10-2004-0076225 A | 8/2004 | |
| KR | 10-2005-0048891 A | 5/2005 | |
| KR | 10-0585175 B1 | 5/2006 | |
| KR | 10-2006-0091160 A | 8/2006 | |
| KR | 10-2007-0025612 A | 3/2007 | |
| KR | 10-0695168 B1 | 3/2007 | |
| KR | 10-2007-0105752 A | 10/2007 | |
| KR | 10-2008-0052362 A | 6/2008 | |
| KR | 10-2008-0080273 A | 9/2008 | |
| KR | 10-2009-0008799 A | 1/2009 | |
| KR | 10-2009-0029488 A | 3/2009 | |
| KR | 10-2009-0036771 A | 4/2009 | |
| KR | 10-2009-0045132 A | 5/2009 | |
| KR | 10-1067969 B1 | 9/2011 | |
| SU | 768457 A | 10/1980 | |
| WO | 0015865 A1 | 3/2000 | |
| WO | 0067300 A1 | 11/2000 | |
| WO | 2004046417 A2 | 6/2004 | |
| WO | 2004076712 A1 | 9/2004 | |
| WO | 2005084231 A2 | 9/2005 | |
| WO | 2006012052 A2 | 2/2006 | |
| WO | 2007070218 A2 | 6/2007 | |
| WO | 2007126690 A2 | 11/2007 | |
| WO | 2007140813 A1 | 12/2007 | |
| WO | 2008002546 A1 | 1/2008 | |
| WO | 2008057616 A2 | 5/2008 | |
| WO | 2009006272 A1 | 1/2009 | |
| WO | 2009020888 A1 | 2/2009 | |
| WO | 2009034775 A1 | 3/2009 | |
| WO | 2009059237 A2 | 5/2009 | |
| WO | 2011002705 A2 | 1/2011 | |
| WO | 2011146913 A2 | 11/2011 | |

OTHER PUBLICATIONS

Allen, F., et al., "Tables of Bond Lengths Determined by X-ray and Neutron Diffraction. Part 1. Bond Lengths in Organic Compounds", "J. Chem. Soc. Perkin Tran. II", 1987, pp. S1-S19.

Anderson, H., "Dialkylaminogermanes and Dialkylaminosilanes", "J. Amer. Chem. Soc.", Mar. 20, 1952, pp. 1421-1423, vol. 74, No. 6.

Anderson, Q., et al., "Synthesis and Characterization of the First Pentaphenylcyclopentadienyl Copper(I) Complex, (Ph5Cp)Cu(PPh3)", "Organometallics", 1998, pp. 4917-4920, vol. 17.

Artaud-Gillet, M., et al., "Evaluation of copper organometallic sources for CuGaSe2 photovoltaic applications", "Journal of Crystal Growth", 2003, pp. 163-168, vol. 248.

Auner, N., et al., "Organosilicon Chemistry IV: From Molecules to Materials", Mar. 2000, p. 291 (Abstract), Publisher: Wiley-VCH.

Baines, K., et al., "A Facile Digermene-to-germylgermylene Rearrangement; Bulky Germylene Insertion into the Si—H Bond", "J. Chem. Soc. Chem. Commun.", 1992, pp. 1484-1485.

Baxter, D., et al., "Low Pressure Chemical Vapor Deposition of Metallic Films of Iron, Manganese, Cobalt, Copper, Germanium and Tin Employing Bis(trimethyl)silylamido Complexes, M(N(SiMe3)2)n", "Chemical Vapor Deposition", 1995, pp. 49-51, vol. 1, No. 2.

Behrens, S., et al., "Synthesis and Structure of the Nanoclusters [Hg32Se14(SePh)36], [Cd32Se14(SePh) 36"(PPh3)4], [P(Et)2(Ph)C4H8OSiMe3]5" [Cd18I17(PSiMe3)12], and [N(Et)3C4H8OSiMe3]5[Cd18I17(PSiMe3)12]", "Angew. Chem. Int. Ed. Engl.", 1996, pp. 2215-2218, vol. 35, No. 19.

Bochmann, M. et al. , "Synthesis of Some Alkyl Metal Selenolato Complexes of Zinc, Cadmium and Mercury, X-Ray Crystal Structure of Me, Hg, Se(2,4,6-Pri3,C6H2)", "Polyhedron", 1992, pp. 507-512, vol. 11, No. 5.

Bradley, D., et al., "Metallo-organic compounds containing metalnitrogen bonds. Part I. Some dialkylamino-derivatives of titanium and Zirconium", "Journal of the Chemical Society", Oct. 1960, pp. 3857-3861.

Bradley, D., et al., "Metallo-organic compounds containing metalnitrogen bonds: Part III. Dialkylamino compounds of tantalum", "Canadian Journal of Chemistry", Jul. 1962, pp. 1355-1360, vol. 40, No. 7.

Bwembya, G., et al., "Phosphinochalcogenoic Amidato Complexes of Zinc and Cadmium as Novel Single-Source Precursors for the Deposition of Metal Selenide and Telluride Films", "Chemical Vapor Deposition", 1995, pp. 78-80, vol. 1, No. 3.

Carmalt, C., et al., "Synthesis of titanium(IV) guanidinate complexes and the formation of titanium carbonitride via low-pressure chemical vapor deposition", "Inorganic Chemistry", Jan. 7, 2005, pp. 615-619, vol. 44, No. 3.

Chen, T., et al., "Low temperature Deposition of Ge Thin Films with a Ge(II) Silylamido Source", "ECS Transactions", 2007, pp. 269-278, vol. 11, No. 7.

Cheng, H., et al., "Wet Etching of Ge2Sb2Te5 Films and Switching Properties of Resultant Phase Change Memory Cells", "Semiconductor Science and Technology", Sep. 26, 2005, pp. 1111-1115, vol. 20, No. 11.

Chiu, H., et al., "Deposition of tantalum nitride thin films from ethylimidotantalum complex", "Journal of Materials Science Letters", Jan. 1992, pp. 96-98, vol. 11, No. 2.

(56) References Cited

OTHER PUBLICATIONS

Cho, K., et al., "Designing PbSe Nanowires and Nanorings through Oriented Attachment of Nanoparticles", "J. Am. Chem. Soc.", Apr. 23, 2005, pp. 7140-7147, vol. 127.
Choi, B., et al., "Combined Atomic Layer and Chemical Vapor Deposition, and Selective Growth of Ge2Sb2Te5 Films on TiN/W Contact Plug", "Chem. Mater.", Aug. 14, 2007, pp. 4387-4389, vol. 19.
Choi, B., et al., "Cyclic PECVD of Ge2Sb2Te5 Films Using Metal-lorganic Sources", "Journal of the Electrochemical Society", Feb. 22, 2007, pp. H318-H324, vol. 154, No. 4.
Chorley, R., et al., "Subvalent Group 14 metal compounds XIV. The X-ray crystal structures of two monomeric Group 14 metal bisamides, Ge[N(SiMe3)2]2 and Sn[NC(Me)2(CH2)3CMe2]2", "Inorganica Chimica Acta", Aug.-Oct. 1992, pp. 203-209, vol. 198-200.
Cole-Hamilton, D., "MOVPE Mechanisms from studies of specially designed and labelled precursors", "Chem. Commun.", 1999, pp. 759-765.
Cummins, C., et al., "Synthesis of Terminal Vanadium(V) Imido, Oxo, Sulfido, Selenido, and Tellurido Complexes by Imido Group or Chalcogen Atom Transfer to Trigonal Monopyramidal", "Inorganic Chemistry", Mar. 30, 1994, pp. 1448-1457, vol. 33, No. 7.
Drake, J., et al., "Studies of Silyl and Germyl Group 6 Species. 5. Silyl and Germyl Derivatives of Methane- and Benzenetellurols", "Inorg. Chem.", 1980, pp. 1879-1883, vol. 19.
Foley, S., et al., "Facile Formation of Rare Terminal Chalcogenido Germanium Complexes with Alkylamidinates as Supporting Ligands", "J. Am. Chem. Soc.", Oct. 29, 1997, pp. 10359-10363, vol. 119, No. 43.
Foley, S., et al., "Synthesis and structural characterization of the first trialylguanidinate and hexahydropyramidinate complexes of tin", "Polyhedron", 2002, pp. 619-627, vol. 21.
Gehrhus, B., et al., "New Reactions of a Silylene: Insertion into M-N Bonds of M[N(SiMe3)2]2 (M=Ge, Sn, or Pb)", "Angew. Chem. Int. Ed. Engl.", 1997, pp. 2514-2516, vol. 36, No. 22.
Gordon, R., et al., "Silicon dimethylamido complexes and ammonia as precursors for the atmospheric pressure chemical vapor deposition of silicon nitride thin films", "Chem. Mater.", Sep. 1990, pp. 480-482, vol. 2, No. 5.
Green, S., et al., "Synthetic, structural and theoretical studies of amidinate and guanidinate stabilised germanium(I) dimers", "Chem. Commun.", Sep. 8, 2006, pp. 3978-3980.
Green, S., et al., "Complexes of an Anionic Gallium(I) N-Heterocyclic Carbene Analogue with Group 14 Element(II) Fragments: Synthetic, Structural and Theoretical Studies", "Inorganic Chem.", Aug. 3, 2006, pp. 7242-7251, vol. 45, No. 18.
Gumrukcu, I., et al., "Electron Spin Resonance of t-Alkyl-, Silyl-, and Germyl-aminyl Radicals and some Observations on the Amides MBr{N(SiMe3)2}3 (M=Ge, Sn, or Pb)", "J.C.S. Chem. Comm.", 1980, pp. 776-777.
Gupta, A., et al., "Triorganoantimony(V) complexes with internally functionallized oximes: synthetic, spectroscopic and structural aspects of [R3Sb(Br)L], [R3Sb(OH)L] and [R3SbL2], crystal and molecular structures of [Me3Sb{ON=C(Me)C4H3O}2], [Me3Sb{ON=C(Me)C4H3S}2], 2-OC4H3C(Me)=NOH and 2-SC4H3C(Me)=NOH", "Journal of Organometallic Chemistry", 2002, pp. 118-126, vol. 645.
Gynane, M., et al., "Subvalent Group 4B Metal Alkyls and Amides. Part 5. The Synthesis and Physical Properties of Thermally Stable Amides of Germanium(II), Tin(II), and Lead(II)", "J. Chem. Soc., Dalton Transactions", 1977, pp. 2004-2009.
Han, L., et al., "Extremely Facile Oxidative Addition of Silyl, Germyl, and Stannyl Tellurides and Other Chalcogenides to Platinum(0) Complexes, X-ray Structure of trans-Pt(4-PhC6H4Te)(SiMe3)(PEt3)2", "J. Am. Chem. Soc.", 1997, pp. 8133-8134, vol. 119.
Harris, D., et al., "Monomeric, Volatile Bivalent Amides of Group IVB Elements, M(NR12)2 and M(NR1R2)2 (M=Ge, Sn, or Pb; R1=Me3Si, R2=Me3C)", "J.C.S. Chem. Comm.", 1974, pp. 895-896.

Hatanpaa, T., et al., "Synthesis and characterisation of cyclopentadienyl complexes of barium: precursors for atomic layer deposition of BaTiO3", "Dalton Trans.", Mar. 22, 2004, pp. 1181-1188, vol. 8.
Herrmann, W., et al., "Stable Cyclic Germanediyls ('Cyclogermylenes'): Synthesis, Structure, Metal Complexes, and Thermolyses", "Angew. Chem. Int. Ed. Engl.", 1992, pp. 1485-1488, vol. 31, No. 11.
Herrmann, W., et al., "Volatile Metal Alkoxides according to the Concept of Donor Functionalization", "Angew. Chem. Int. Ed. Engl.", 1995, pp. 2187-2206, vol. 34.
Hitchcock, P., et al., "Subvalent Group 14 Metal Compounds-XIII. Oxidative Addition Reactions of Germanium and Tin Amides With Sulphur, Selenium, Tellurium or MeOOCC=CCOOMe; X-Ray Structures of [Ge(NR2)2(mu-Te)]2 and Sn(NR2)2CC(OMe)OSn(NR2)2CC(OMe)O", "Polyhedron", 1991, pp. 1203-1213, vol. 10, No. 117.
Hitchcock, P., et al., "Synthesis and Structures of Bis[bis(trimethylsilyl)amido]-tin(iv) Cyclic Chalcogenides [{Sn[N(Si Me3)2]2(mu-E)}2] and a Heterobimetallic Analogue [{(Me3Si)2N}2Ge(mu-Te)2Sn-{N(SiMe3)2}2] (E=S, Se or Te", "J. Chem Soc. Dalton Trans.", 1995, pp. 3179-3187.
Hor, Y., et al, "Superconducting NbSe2 nanowires and nanoribbons converted from NbSe3 nanostructures", "Applied Physics Letters", Sep. 27, 2005, pp. 1-3, vol. 87, No. 142506.
Hudgens, S., et al., "Overview of Phase Change Chalcogenide Nonvolatile Memory Technology", "MRS Bulletin", Nov. 2004, pp. 1-5.
George, T., et al., "Amino-derivatives of Metals and Metalloids. Part II. Amino-stannylation of Unsaturated Substrates, and the Infrared Spectra and Structures of Carbarmato- and Dithiocarbamato-trimethylstannanes and Related Compounds", "J. Chemical Society", 1965, pp. 2157-2165, No. 385.
Just, O., et al., "Synthesis and Single-Crystal X-ray Diffraction Examination of a Structurally Homologous Series of Tetracoordinate Heteroleptic Anionic Lanthanide Complexes: Ln{N[Si(CH3)2CH2CH2Si(CH3)2]}3(i-Cl)Li(L)3 [Ln=Sm, Eu, Gd, Tb, Dy, Ho, Er, Tm, Yb; (L)3=(THF)3, (Et2O)3, (THF)2(Et2O)]", "Inorg. Chem.", Mar. 9, 2001, pp. 1751-1755, vol. 40, No. 8.
Kapoor, P., et al., "High surface area homogeneous nanocrystalline bimetallic oxides obtained by hydrolysis of bimetallic mu-oxo alkoxides", "J. Mater. Chem.", Jan. 14, 2003, pp. 410-414, vol. 13.
Karsch, H., et al., "Bis(amidinate) Complexes of Silicon and Germanium", "Eur. J. Inorg. Chemistry", Apr. 1998, pp. 433-436, vol. 4.
Kim, R., et al., "Structural Properties of Ge2Sb2Te5 thin films by metal organic chemical vapor deposition for phase change memory applications", "Applied Physics Letters", Sep. 6, 2006, pp. 1-3, vol. 89, No. 102107.
Kim, S., et al., "Electrical Properties and Crystal Structures of Nitrogen-Doped Ge2Sb2Te5 Thin Film for Phase Change Memory", "Thin Solid Films", Dec. 22, 2004, pp. 322-326, vol. 469-470.
Kuchta, M., et al., "Multiple Bonding Between Germanium and the Chalcogens: The Syntheses and Structures of the Terminal Chalogenido Complexes (q4-Me8taa)GeE (E=S, Se, Te)", "J. Chem. Soc. Chem. Commun.", 1994, pp. 1351-1352.
Kuchta, M., et al., "Comparison of the reactivity of germanium and tin terminal chalcogenido complexes: the syntheses of chalcogenolate and dichalcogenidostannacyclopentane derivatives", "Chem. Commun.", 1996, pp. 1669-1670.
Kuehl, O., "N-heterocyclic germylenes and related compounds", "Coordination Chemistry Reviews", 2004, pp. 411-427, vol. 248.
Lappert, M., et al., "Monomeric Bivalent Group 4B Metal Dialkylamides M[NCMe2(CH2)3CMe2] (M=Ge or Sn), and the Structure of a Gaseous Disilylamide, Sn[N(SiMe3)2]2, by Gas Electron Diffraction", "J.C.S. Chem. Comm.", 1979, pp. 369-370, vol. 8.
Lappert, M., et al., "Monomeric, Coloured Germanium(II) and Tin(II) Di-t-Butylamides, and the Crystal and Molecular Structure of Ge(NCMe2[CH2]3CMe2)2", "J.C.S. Chem. Comm.", 1980, pp. 621-622, vol. 13.
Lee, J., et al., "GeSbTe deposition for the PRAM application", "Applied Surface Science", Feb. 2007, pp. 3969-3976, vol. 253, No. 8.

(56) References Cited

OTHER PUBLICATIONS

Leskela, M., et al., "Atomic layer deposition chemistry: recent developments and future challenges", "Angew. Chem. Int. Ed.", Nov. 24, 2003, pp. 5548-5554, vol. 42, No. 45.
Macomber, D., et al., "(n5-Cyclopentadienyl)- and {n5-Pentamethylcyclopentadienyl}copper Compounds Containing Phosphine, Carbonyl, and eta2-Acetylenic Ligands", "J. Am. Chem. Soc.", 1983, pp. 5325-5329, vol. 105.
Maruyama, T., et al., "Silicon dioxide thin films prepared by chemical vapor deposition from tetrakis(diethylamino) silane and ozone", "Appl. Phys. Letters", May 23, 1994, pp. 2800-2802, vol. 64, No. 21.
Maruyama, T., "Electrical Characterization of Silicon Dioxide Thin Films Prepared by Chemical Vapor Deposition from Tetrakis(diethylamino)silane and Ozone", "Jpn. J. Appl. Phys.", Jul. 15, 1997, pp. L922-L925, vol. 36, Part 2, No. 7B.
Mathur, S., et al., "Germanium Nanowires and Core-Shell Nanostructures by Chemical Vapor Deposition of [Ge(C5H5)2]", "Chem. Mater.", May 15, 2004, pp. 2449-2456, vol. 16, No. 12.
Matsuda, I., et al., "Reactions of Group IV Organometallic Compounds: XXVIII. The Insertion Reactions of Benzoyl-Tert-Butylcarbodiimide With With Group IV Trimethylmetallylamines and the Preparation of Trimethyl-Silyl- and -Germyl-tert-Butyl-Carbodiimide", "Journal of Organometallic Chemistry", 1974, pp. 353-359, vol. 69.
Meller, A., et al., "Synthesis and Isolation of New Germanium(II) Compounds and of Free Germylenes", "Chem. Ber.", May 1985, pp. 2020-2029 (English Abstract), vol. 118, No. 5.
Metzler, N., et al., "Synthesis of a silylene-borane adduct and its slow conversion to a silylborane", "Chem. Commun.", 1996, pp. 2657-2658.
Neumann, W., "Germylenes and Stannylenes", "Chem. Rev.", 1991, pp. 311-334, vol. 91, Publisher: American Chemical Society.
Oakley, S., et al., "Structural consequences of the prohibition of hydrogen bonding in copper-guanidine systems", "Inorg. Chem.", Jul. 13, 2004, pp. 5168-5172, vol. 43, No. 16 (Abstract).
O'Brien, P., et al., "Single-molecule Precursor Chemistry for the Deposition of Chalcogenide(S or Se)-containing Compound Semiconductors by MOCVD and Related Methods", "J. Mater. Chem.", 1995, pp. 1761-1773, vol. 5, No. 11.
Ovshinsky, S., "Reversible Electrical Switching Phenomena in Disordered Structures", "Physical Review Letters", Nov. 11, 1968, pp. 1450-1455, vol. 21, No. 20.
Pickett, N., et al., "Gas-phase formation of zinc/cadmium chalcogenide cluster complexes and their solid-state thermal decomposition to form II-VI nanoparticulate material", "J. Mater. Chem.", 1998, pp. 2769-2776, vol. 8.
Privitera, S., et al., "Phase change mechanisms in Ge2Sb2Te5", "Journal of Applied Physics", Jul. 9, 2007, pp. 1-5, vol. 102, No. 013516.
Raj, P., et al., "Synthesis and characterization of the complex triorganoantimony (V) cations, R3SbL'2+ and R3Sb (L-L)2+", "Synthesis and Reactivity in Inorganic and Metal-Organic Chemistry", 1992, pp. 543-557 (Abstract), vol. 22, No. 5.
Raj, P., et al., "Synthesis and geometry of complex triorganoantimony(V) cations", "Synthesis and Reactivity in Inorganic and Metal-Organic Chemistry", 1992, pp. 1471-1494 (Abstract), vol. 22, No. 10.
Raoux, S., et al., "Influence of Dopants on the Crystallization Temperature, Crystal Structure, Resistance, and Threshold Field for Ge2Sb2Te5 and GeTe Phase Change Materials", "European/Phase Change and Ovonics Symposium", Sep. 4-6, 2011, pp. 1-8, Published in: Zuerich, Switzerland.
Raoux, S., et al., "Materials Engineering for Phase Change Random Access Memory", "11th Annual Non-Volatile Memory Technology Symposium (NVMTS)", Nov. 7-9, 2011, pp. 1-5.
Ren, H., et al., "Synthesis and structures of cyclopentadienyl N-heterocyclic carbene copper(I) complexes", "Journal of Organometallic Chemistry", Jun. 21, 2006, pp. 4109-4113, vol. 691.
Richardson, M., et al., "Volatile rare earth chelates of 1,1,1,5,5,5-hexafluoro-2,4-pentanedione and 1,1,1,2,2,3,3,7,7,7-decafluoro-4,6-heptanedione", "Inorganic Chemistry", 1971, pp. 498-504, vol. 10, No. 3.
Ritch, J., et al., "The single molecular precursor approach to metal telluride thin films: imino-bis (diisopropylphosphine tellurides) as examples", "Chem. Soc. Rev.", Jun. 27, 2007, pp. 1622-1631, vol. 36.
Sasamori, T., et al., "Reactions of a Germacyclopropabenzene with Elemental Chalcogens: Syntheses and Structures of a Series of Stable 2H-Benzo[c][1,2]chalcogenagermetes", "Organometallics", Jan. 14, 2005, pp. 612-618, vol. 24.
Schlecht, S., et al., "Direct Synthesis of (PhSe)4Ge and (PhTe)4Ge from Activated Hydrogenated Germanium—Crystal Structure and Twinning of (PhTe)4Ge", "Eur. J. Inorg. Chem.", 2003, pp. 1411-1415.
Shenai, D. et al., "Safer alternative liquid germanium precursors for relaxed graded SiGe layers and strained silicon by MOVPE", "Journal of Crystal Growth", Jan. 8, 2007, pp. 172-175, vol. 298.
Shi, Y., et al., "Titanium dipyrrolylmethane derivatives: rapid intermolecular alkyne hydroamination", "Chem. Comm.", Mar. 7, 2003, pp. 586-587, No. 5.
Stauf, G., et al., "Low Temperature ALD of Germanium for Phase Change Memory Thin Films", "AVS 7th International Conference on Atomic Layer Deposition—ALD 2007", Jun. 24, 2007, pp. 1-8.
Steigerwald, M., et al., "Organometallic Synthesis of II-VI Semiconductors. 1. Formation and Decomposition of Bis(organotelluro)mercury and Bis(organotelluro)cadmium Compounds", "J. Am. Chem. Soc. ", 1987, pp. 7200-7201, vol. 109.
Sun, S., et al., "Performance of MOCVD tantalum nitride diffusion barrier for copper metallization", "1995 Symposium on VLSI Technology Digest of Technical Papers", Jun. 1995, pp. 29-30.
Tsai, M., et al., "Metalorganic chemical vapor deposition of tantalum nitride by tertbutylimidotris(diethylamido) tantalum for advanced metallization", "Appl. Phys. Lett.", Aug. 21, 1995, pp. 1128-1130, vol. 67, No. 8.
Tsai, M., et al., "Metal-organic chemical vapor deposition of tantalum nitride barrier layers for ULSI applications", "Thin Solid Films", Dec. 1, 1995, pp. 531-536, vol. 270, No. 1-2.
Tsumuraya, T., et al., "Telluradigermiranes. A Novel Three-membered Ring System Containing Tellurium", "J. Chem. Soc. Chem. Commun.", 1990, pp. 1159-1160.
Vehkamaki, M., et al., "Atomic Layer Deposition of SrTiO3 Thin Films from a Novel Strontium Precursor-Strontium-bis(triisopropylcyclopentadienyl", "Chemical Vapor Deposition", Mar. 2001, pp. 75-80, vol. 7, No. 2.
Veith, M., et al., "Additionsreaktionen an intramolekular basenstabilisierte Ge=N- und Ge=S-Doppelbindungen", "Chem. Ber.", 1991, pp. 1135-1141 (English Abstract), vol. 124.
Veith, M., et al., "New perspectives in the tailoring of hetero (bi and tri-) metallic alkoxide derivatives", "Polyhedron", 1998, pp. 1005-1034, vol. 17, No. 5-6.
Horii, H., et al., "A Novel Cell Technology Using N-Doped GeSbTe Films for Phase Change RAM", "Symposium on VLSI Technology Digest of Technical Papers", Jun. 10-12, 2003, pp. 177-178.
Veprek, S., et al., "Organometallic chemical vapor deposition of germanium from a cyclic germylene, 1,3-Di-tert-butyl-1,3,2-diazagermolidin-2-ylidine.", "Chem. Mater.", 1996, pp. 825-831, vol. 8.
Weller, H., "Colloidal Semiconductor Q-Particles: Chemistry in the Transition Region Between Solid State and Molecules", "Angew. Chem. Int. Ed. Engl.", 1993, pp. 41-53, vol. 32.
Weller, H., "Self-organized Superlattices of Nanoparticles", "Angew. Chem. Int. Ed. Engl.", 1996, pp. 1079-1081, vol. 35, No. 10.
Veith, M., et al, "Molecular precursors for (nano) materials—a one step strategy", "J. Chem. Soc. Dalton. Trans.", May 20, 2002, pp. 2405-2412.

\* cited by examiner

GERMANIUM ANTIMONY TELLURIDE MATERIALS AND DEVICES INCORPORATING SAME

CROSS-REFERENCE TO RELATED APPLICATIONS

This application is a U.S. national phase under the provisions of 35 U.S.C. §371 of International Patent Application No. PCT/US2011/037479 filed May 21, 2011, which in turn claims the benefit of priority of the following U.S. provisional patent applications under the provisions of 35 USC 119: U.S. Provisional Patent Application No. 61/347,347 filed May 21, 2010; U.S. Provisional Patent Application No. 61/365,744 filed Jul. 19, 2010; U.S. Provisional Patent Application No. 61/378,385 filed Aug. 30, 2010; U.S. Provisional Patent Application No. 61/379,381 filed Sep. 1, 2010; and U.S. Provisional Patent Application No. 61/379,386 filed Sep. 1, 2010. The disclosures of such international patent application and all of the foregoing U.S. provisional patent applications are hereby incorporated herein by reference, in their respective entireties, for all purposes.

TECHNICAL FIELD

The present invention relates generally to germanium antimony telluride materials and to microelectronic devices and device structures incorporating same.

BACKGROUND

Materials such as germanium (Ge), antimony (Sb), and tellurium (Te) can be deposited onto substrates to form GeSbTe (GST) alloys as phase change memory (PCM) materials for use in semiconductor wafers or other semiconductor device structures. The conformal deposition of such materials in the forms of GST films is desirable for use in semiconductor device structures having high aspect ratio topographical features such as vias.

The deposition of GST materials to form films for PCM applications can be carried out using vapor deposition processes, such as chemical vapor deposition (CVD), metalorganic chemical vapor deposition (MOCVD), atomic layer deposition (ALD), or other vapor phase techniques.

PCM technology has the potential to expand commercially into dynamic random access memory (DRAM) and storage class memory (SCM) applications. These applications require long cycling endurance and fast write speeds while maintaining sufficient data retention character, as well as maintaining a low set resistance at small device scales and high aspect ratios. In this respect, alloy compositions and device structure have major and related impact on the PCM performance of the product device. The ability to conformally deposit GST films enables improved PCM cell heating efficiency with lower reset current, by minimizing the amount of GST film material in the cell and reducing heat loss.

Significant efforts are ongoing to improve performance of PCM alloy compositions and device performance (e.g., device speed, cycle endurance), relative to that achieved by the GST225 alloy (atomic composition 22.5% Ge, 22.5% Sb, and 55% Te) currently used as a benchmark standard for PCM films and devices.

The processing and handling of Ge, Sb, and Te materials for applying GST films using CVD normally occurs at substrate temperatures above about 300 degrees C. The reason for this is that typical precursors for CVD processes generally utilize such high temperatures to promote molecular reactivity. However, amorphous or partially amorphous GST films are desired to attain the conformal deposition of the films and thus the substrate process temperature is preferred to be below the GST crystallization temperature, which is generally less than about 300 degrees C. This, however, has proven difficult, since tellurium precursors used in chemical vapor deposition processes are difficult to activate and only have suitable reactivity at temperatures typically higher than 300 degrees C. Further, because conventional CVD techniques utilize precursors in the deposition of the GST at processing temperatures of 300 degrees C. and above, the deposition of the GST film generally results in the crystallization of the film and thus is typically not conformal, particularly when Te is present in amounts above about 45% in the product GST film.

There is therefore a compelling need for improved GST films and phase change microelectronic devices utilizing same, e.g., for PCRAM applications.

SUMMARY

In one aspect, the present disclosure relates to a chalcogenide alloy composition, having an atomic composition comprising from 34 to 45% Ge, from 2 to 16% Sb, from 48 to 55% Te, from 3 to 15% carbon and from 1 to 10% nitrogen, wherein all atomic percentages of all components of the film total to 100 atomic %.

In another aspect the disclosure relates to a chalcogenide alloy composition, (i) having an atomic composition of germanium, antimony and tellurium comprising 36% Ge, 14% Sb, and 50% Te, (ii) doped with from 8 to 12 at. % carbon and doped with from 1 to 10 at. % nitrogen, wherein dopant atomic percentages are based on total atomic percentages of all components of the composition including dopants.

In a further aspect, the disclosure relates to a phase change memory device comprising a chalcogenide alloy film, having an atomic composition comprising from 34 to 45% Ge, from 2 to 16% Sb, from 48 to 55% Te, from 5 to 15% carbon and from 1 to 10% nitrogen, wherein all atomic percentages of all components of the film total to 100 atomic %.

Yet another aspect of the disclosure relates to a microelectronic device including a alloy composition of the foregoing type.

Another aspect of the disclosure relates to a chalcogenide alloy composition, having an atomic composition comprising 36 at % Ge, 13 at % Sb, from 51 at % Te, based on total atomic weight of Ge, Sb and Te in the composition, and doped with from 3 to 15 at % carbon and from 1 to 10 at % nitrogen, wherein atomic percentages of carbon and nitrogen are based on total atomic weight of Ge, Sb, Te, C and N in the composition.

Yet another aspect of the disclosure relates to a method of enhancing set speed of a chalcogenide alloy composition for use in a phase change memory device, wherein said chalcogenide alloy composition has an atomic composition comprising from 34 to 45% Ge, from 2 to 16% Sb, from 48 to 55% Te, based on total atomic weights of Ge, Sb and Te in the composition, and doped with from 3 to 15% carbon and from 1 to 10% nitrogen, wherein atomic percentages of carbon and nitrogen are based on total atomic weight of Ge, Sb, Te, C and N in the composition, said method comprising annealing said chalcogenide alloy composition in an inert atmosphere for 10 to 40 hours at temperature in a range of from 300 to 475° C.

A further aspect of the disclosure relates to a microelectronic system comprising a phase change memory including a GST alloy composition having a set speed of less than 15 nanoseconds.

In another aspect, the disclosure relates to a PCM GST device structure comprising a TiAlN layer with an SiO$_2$ layer thereon, wherein the SiO$_2$ layer has a pore therein bounded at a lower end thereof by the TiAlN layer, a GST alloy composition filling the pore and in a layer above the pore that extends laterally outwardly to overlie the SiO$_2$ layer surrounding the pore, a layer of TiN overlying the GST alloy layer and generally coextensive therewith, and a layer of aluminum overlying the layer of TiN and extending laterally beyond the TiN layer and downwardly at an outer lateral periphery to the SiO$_2$ layer, thereby encapsulating the GST alloy composition and TiN layer.

Another aspect of the disclosure relates to a method of fabricating a PCM GST device structure, comprising:

providing a substrate including an SiO$_2$ layer thereon, wherein the SiO$_2$ layer has a pore therein bounded at a lower end thereof by a TiAlN layer;

depositing a GST alloy composition in and over the pore and SiO$_2$ layer surrounding the pore;

depositing a layer of TiN over the deposited GST alloy composition to form a TiN/GST alloy composition stack structure;

patterning and etching of the TiN/GST alloy composition stack structure to form an isolated PCM device structure;

depositing aluminum over the PCM device structure; and patterning and etching the deposited aluminum to form an isolated aluminum pad in contact at its outer periphery with the SiO$_2$ layer, to encapsulate the PCM device structure.

A further aspect of the disclosure relates to a phase change memory cell including a GST material, having a set speed below 20 ns, and endurance of $10^8$ cycles or more (e.g., $\geq 10^9$ cycles or $\geq 10^{10}$ cycles). Such cell in specific implementations has a 10-year retention greater than 70° C., greater than 100° C., greater than 110° C., or greater than 115° C. In specific embodiments, such phase change memory cell has a set speed at least as low as 12 ns, and in other embodiments, the phase change memory cell has a set speed in a range of from 12 to 18 ns. The GST material in such cell can be an MOCVD GST alloy that is deposited in a confined hole or trench structure, e.g., with a critical dimension of 100 nm, or otherwise in a via structure having a low aspect ratio of less than 1:1, preferably without voids or seams.

Yet another aspect of the disclosure relates to a change memory cell including a GST material having a set speed below 20 ns, and endurance of $10^9$ cycles or more.

A still further aspect of the disclosure relates to a GST composition comprising a 415 MOCVD alloy having a set speed of less than 70 ns.

Another aspect of the disclosure relates to a GST composition comprising a 415 MOCVD alloy having a data retention of 118° C.

A further aspect of the invention relates to a GST composition comprising 36% Ge, 14% Sb, and 50% Te, with C and N doping, exhibiting a multi-level resistance level that is sustainable for at least 10 years without interference of resistance values thereof.

Yet another aspect of the disclosure relates to a change memory cell including a GST material having a set speed below 20 ns, and endurance of $10^9$ cycles or more.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein and in the appended claims, the singular forms "a", "and", and "the" include plural referents unless the context clearly dictates otherwise.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

In reference herein to chalcogenide alloys and chalcogenide alloys doped with carbon and/or nitrogen, percentages of germanium, antimony and tellurium in GST alloy compositions will be understood to refer to atomic percentages based on the total atomic weights of germanium, antimony and tellurium in the composition, and the atomic percentages of carbon and nitrogen will be understood to be based on total atomic weight of Ge, Sb, Te, C and N in the composition.

Other aspects, features and advantages of the disclosure will be more fully apparent from the ensuing description.

BRIEF DESCRIPTION OF DRAWINGS

FIGS. 7-12 are data plots for an MOCVD GST 415 alloy composition containing 40% germanium, 10% antimony and 50% tellurium, wherein FIG. 7 is a plot of resistance in ohms, as a function of current, in milliamps, FIG. 8 is a plot of current, in milliamps, as a function of voltage, FIG. 9 is a plot of V(v), dV/dl (Kohms), and Log R (ohms), as a function of number of cycles, FIG. 10 is a plot of resistance, in ohms, as a function of Saturated Pulse Trailing Edge Fall Time, in seconds, in which the fall time is the set speed, FIG. 11 is a plot of time to fail, in seconds, as a function of 1/kT(eV−1), and FIG. 12 is a plot of resistance, in ohms, as a function of 1/kT(eV−1), FIG. 13 is a plot of resistance, in kiloohms, as a function of square pulse, in nanoseconds, for set resistance ($R_{set}$) demarcation resistance ($R_{demarcation}$) and reset resistance ($R_{reset}$), FIG. 14 is a plot of resistance, in kiloohms, as a function of number of cycles for set resistance ($R_{set}$) and reset resistance ($R_{reset}$), FIG. 15 is a plot of read resistance, in ohms, as a function of square pulse width, in seconds, and FIG. 16 is a plot of read resistance, in ohms, as a function of square pulse width, in seconds.

DETAILED DESCRIPTION

Figure 1:
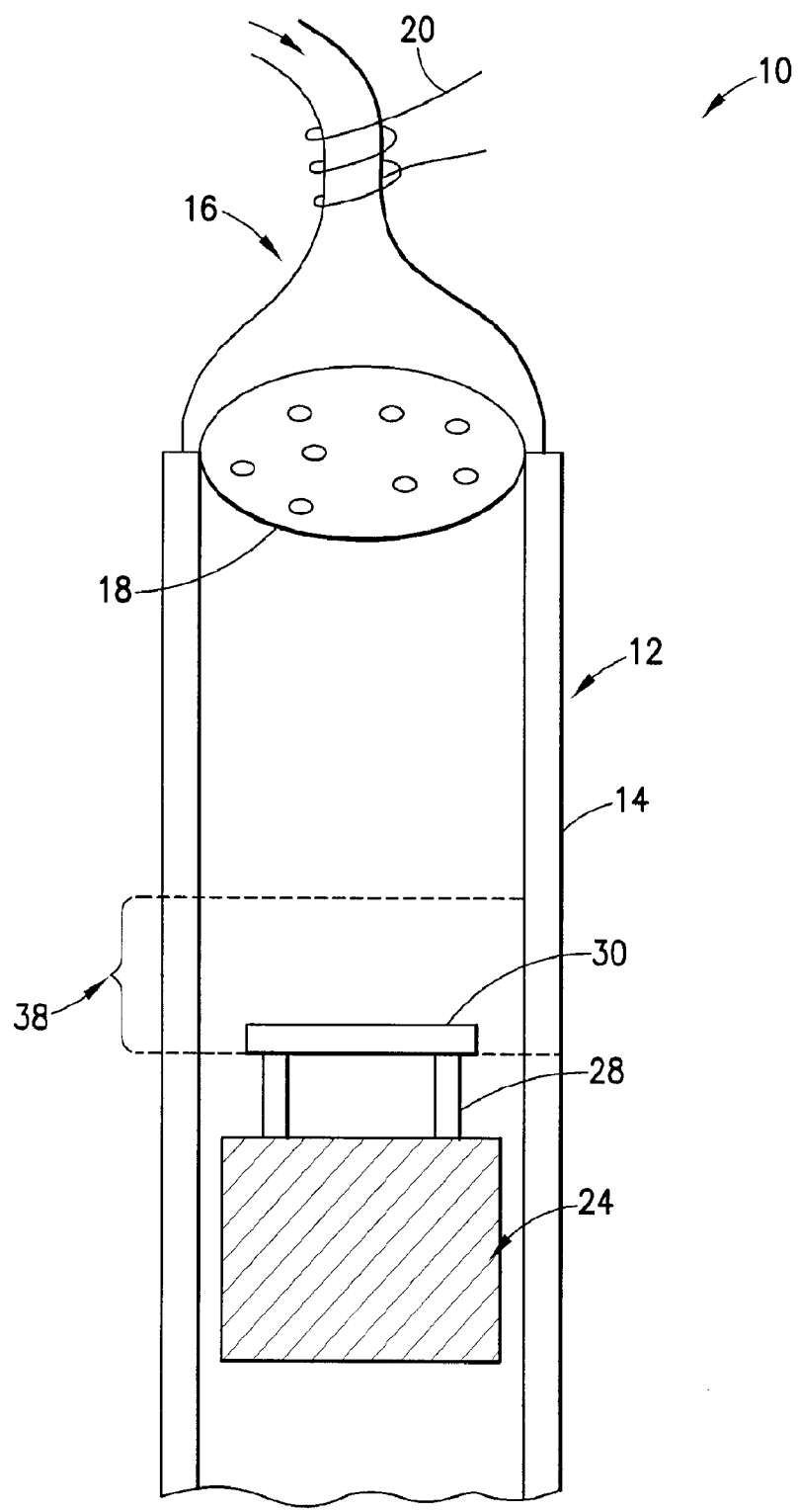
FIG. 1 is a schematic representation of a GST deposition process system that can be employed to form the chalcogenide materials of the present disclosure.

All percentages expressed herein are atomic percentages.

Unless otherwise specified, all film compositions herein are specified in terms of atomic percentages of the film components, wherein the sum of all atomic percentages of all components in the film totals to 100 atomic %.

As used herein, the term CVD is defined as the deposition of a solid on a surface from a chemical precursor, and includes but is not limited to the following: Atmospheric pressure CVD (APCVD), Low pressure CVD (LPCVD), Ultrahigh vacuum CVD (UHVCVD), Aerosol-assisted CVD (AACVD), Digital CVD (DCVD), Direct liquid injection CVD (DLICVD), Microwave plasma-assisted CVD (MPCVD), Plasma-enhanced CVD (PECVD), Remote plasma-enhanced CVD (RPECVD), Atomic layer CVD (ALCVD), Hot wire CVD (HWCVD), Metalorganic chemical vapor deposition (MOCVD), Hybrid physical-chemical vapor deposition (HPCVD), Rapid thermal CVD (RTCVD), and Vapor phase epitaxy (VPE).

The present disclosure relates in a primary aspect to chalcogenide materials having utility for manufacture of semiconductor materials, devices and device precursor structures.

The chalcogenide materials can for example include a chalcogenide alloy composition, having an atomic composition comprising from 34 to 45% Ge, from 2 to 16% Sb, from 48 to 55% Te, from 3 to 15% carbon and from 1 to 10% nitrogen, wherein all atomic percentages of all components of the film total to 100 atomic %. In other embodiments, the amounts of carbon and nitrogen can be decreased to as low as 0.5% or increased as high as 20%, or any other suitable concentrations can be employed of such components in the chalcogenide material.

Alloy compositions of such type, having a set speed of less than 20 nanoseconds, and/or a cycle endurance greater than $1 \times 10^9$, can be usefully employed in phase change semiconductor applications as random access memory materials.

Set speed of the GST alloy composition when configured with electrodes and a power supply in a device configuration, and cycle endurance, can be readily determined by techniques known to those skilled in the art. Phase change speeds involving crystallization and re-amorphization may be accurately measured utilizing laser techniques, within the skill of the art.

Another aspect of the disclosure relates to a chalcogenide alloy composition, (i) having an atomic composition of germanium, antimony and tellurium comprising 36% Ge, 14% Sb, and 50% Te, (ii) doped with from 8 to 12 at. % carbon and doped with from 1 to 10 at. % nitrogen, wherein dopant atomic percentages are based on total atomic percentages of all components of the composition including dopants.

A further aspect of the disclosure relates to a phase change memory device comprising a chalcogenide alloy film, having an atomic composition comprising from 34 to 45% Ge, from 2 to 16% Sb, from 48 to 55% Te, from 5 to 15% carbon and from 1 to 10% nitrogen, wherein all atomic percentages of all components of the film total to 100 atomic %. Such phase change memory device can comprise a phase change random access memory cell, or a phase change random access memory per se.

The disclosure in another aspect relates to a chalcogenide alloy composition, having an atomic composition comprising 36 at % Ge, 13 at % Sb, from 51 at % Te, based on total atomic weight of Ge, Sb and Te in the composition, and doped with from 3 to 15 at % carbon and from 1 to 10 at % nitrogen, wherein atomic percentages of carbon and nitrogen are based on total atomic weight of Ge, Sb, Te, C and N in the composition.

Alloy compositions of such type have been determined to have superior properties rendering them highly useful in Ge—Sb—Te phase change memory applications. In various embodiments, such alloy compositions evidence extremely short set speeds, such as less than 20 nanoseconds in some device implementations, and less than 15 nanoseconds in other implementations. The alloy compositions also exhibit superior cycle endurance, typically greater than $1 \times 10^9$ cycles.

Such alloy compositions can be readily conformally coated on substrates, e.g., by vapor deposition techniques. The substrate can be a wafer or microelectronic device or device precursor substrate. The disclosure therefore contemplates microelectronic device structures including alloy compositions of the aforementioned types. In various embodiments, the alloy compositions of the disclosure can be incorporated in phase change random access memory cells, or otherwise in memory devices of apparatus such as vehicles, smart appliances, computer systems, power monitoring and generation systems, etc.

The disclosure contemplates a method of enhancing set speed of a chalcogenide alloy composition for use in a phase change memory device, wherein the chalcogenide alloy composition has an atomic composition comprising from 34 to 45% Ge, from 2 to 16% Sb, from 48 to 55% Te, based on total atomic weights of Ge, Sb and Te in the composition, and doped with from 3 to 15% carbon and from 1 to 10% nitrogen, wherein atomic percentages of carbon and nitrogen are based on total atomic weight of Ge, Sb, Te, C and N in the composition. Such method comprises annealing the chalcogenide alloy composition in an inert atmosphere for 10 to 40 hours at temperature in a range of from 300 to 475° C. The inert atmosphere can for example comprise a nitrogen atmosphere, or atmosphere of argon, helium, xenon, or other inert gas, as appropriate to the specific application involved. The annealing can be carried out to modify the microstructure of the GST alloy, so that nucleation occurs more readily, and fast crystalline etch or increase of nucleation sites is realized, thereby achieving faster set speed.

The chalcogenide alloy composition of the disclosure can be embodied in a phase change random access memory cell of the phase change memory device, or otherwise in a PCM device, or a sub- or superassembly comprising same. In one embodiment, the chalcogenide alloy composition has an atomic composition comprising 36 at % Ge, 13 at % Sb, from 51 at % Te, based on total atomic weight of Ge, Sb and Te in the composition, and is doped with from 3 to 15 at % carbon and from 1 to 10 at % nitrogen, wherein atomic percentages of carbon and nitrogen are based on total atomic weight of Ge, Sb, Te, C and N in the composition.

Thus, the disclosure contemplates microelectronic systems comprising a phase change memory including a GST alloy composition having a set speed of less than 15 nanoseconds. In one embodiment, the disclosure relates to a phase change memory cell including a GST material a set speed below 20 ns, endurance of $10^9$ cycles or more, and a 10-year retention greater than 70° C. The GST material in such device structure may be in a confined hole or trench structure with a critical dimension of 100 nm. In other embodiments, the GST material can be provided in a low aspect ratio (<1:1) pore or via, preferably without voids or seams in the GST material therein. In still other specific embodiments, such phase change memory cell has a set speed at least as low as 12 ns, and in other embodiments, the phase change memory cell has a set speed in a range of from 12 to 18 ns.

Memory cells of such type can be fabricated with suitable GST MOCVD alloy compositions within the scope of the present disclosure. Compositions useful for such purpose include a GST alloy containing 36% germanium, 14% antimony, and 50% tellurium. Other suitable GST alloy compositions for phase change memory cells include alloy compositions selected from the group consisting of 225 GST alloy, 325 GST alloy, and 415 GST alloy. A high-performance DRAM device can be fabricated including a phase change memory cell of any of the foregoing types. In other specific embodiments, Ge, Sb, and Te composition may be purposely deviated from the Ge, Sb, and Te concentrations in the above-mentioned 225, 325 and 415 alloys, for optimal performance.

In use, the alloy composition of the disclosure can be conformally coated on a substrate by a vapor deposition technique such as chemical vapor deposition or metalorganic chemical vapor deposition or atomic layer deposition, or other suitable process. The substrate can comprise a microelectronic device or device precursor structure substrate.

Such deposition process may be carried out at suitably low temperature, e.g., below 300 degrees C., in order to maintain amorphicity of the deposited film material, and to beneficially impart carbon to the film, and thereby enhance nucleation and growth characteristics of the chalcogenide film.

The chalcogenide materials of the invention can be utilized to form a microelectronic device including such alloy composition. The microelectronic device can comprise a phase change memory cell or a memory device per se.

In another aspect, the disclosure relates to a PCM GST device structure comprising a TiAlN layer with an $SiO_2$ layer thereon, wherein the $SiO_2$ layer has a pore therein bounded at a lower end thereof by the TiAlN layer, a GST alloy composition filling the pore and in a layer above the pore that extends laterally outwardly to overlie the $SiO_2$ layer surrounding the pore, a layer of TiN overlying the GST alloy layer and generally coextensive therewith, and a layer of aluminum overlying the layer of TiN and extending laterally beyond the TiN layer and downwardly at an outer lateral periphery to the $SiO_2$ layer, thereby encapsulating the GST alloy composition and TiN layer.

Another aspect of the disclosure relates to a method of fabricating a PCM GST device structure, comprising:
providing a substrate including an $SiO_2$ layer thereon, wherein the $SiO_2$ layer has a pore therein bounded at a lower end thereof by a TiAlN layer;
depositing a GST alloy composition in and over the pore and $SiO_2$ layer surrounding the pore;
depositing a layer of TiN over the deposited GST alloy composition to form a TiN/GST alloy composition stack structure;
patterning and etching of the TiN/GST alloy composition stack structure to form an isolated PCM device structure;
depositing aluminum over the PCM device structure; and
patterning and etching the deposited aluminum to form an isolated aluminum pad in contact at its outer periphery with the $SiO_2$ layer, to encapsulate the PCM device structure.

The deposition of the GST alloy composition may be carried out in any suitable manner, e.g., by a metalorganic chemical vapor deposition process.

Referring now to the drawings, FIG. 1 is a schematic representation of a GST deposition process system that can be employed to form the chalcogenide materials of the present disclosure. This system for producing and depositing low temperature GST materials is generally designated by the reference number 10 and hereinafter referred to as "system 10." In the process of using system 10, GST materials comprising reactants are deposited onto a substrate (hereinafter referred to as "wafer") as a film to form a phase change material (PCM) device.

The system 10 comprises a deposition chamber 12 or furnace defined by at least one wall 14. However, the present invention is not limited in this regard, as other configurations are possible. The inner surface of the wall of the deposition chamber 12 defines a heat shield 14. An inlet 16 is located in the deposition chamber 12 to allow for the introduction of the reactants (e.g., precursors, co-reactants, and inert materials such as carriers) into the system 10. The inlet 16 is located in communication with any suitable source, such as a ProEvap® carrier gas operating system (ATMI, Inc., Danbury, Conn., USA), from which the reactants are delivered. A showerhead 18 is located downstream of the inlet 16 to facilitate the efficient dispersal and delivery of the reactants delivered from the source. The present invention is not limited to the use of a showerhead, however, as other similar devices are within the scope of this disclosure. A heating coil 20 or any other suitable heating device may be located at the inlet 16 to heat the reactants during delivery thereof from the source.

The reactants may be pre-cracking compositions, pre-reaction compositions, partial decomposition products, and/or other materials that are suitable for controllably altering reaction conditions in the deposition chamber to produce the desired film. Exemplary reactants include, but are not limited to, germanium n-butylamidinate (germanium precursor), tris(dimethylamido)antimony (antimony precursor), and diterbutyltelluride (tellurium precursor).

A heating stage 24 is located in the deposition chamber 12. The heating stage 24 can be heated using any suitable source of energy to cause heat to radiate therefrom. For example, the heating stage 24 may be heated using an electric current. The present invention is not so limited, however, as the heating stage 24 can be heated using other means.

The heating stage 24 comprises one or more support pins 28 that extend therethrough, each support pins being configured to support a wafer 30 on which the GST materials are deposited. Any suitable number of support pins 28 can be used to support the wafer 30. For example, three support pins 28 arranged in a triangular pattern can be used. The present invention is not limited to any particular number of support pins 28 or any particular arrangement thereof, as any number and arrangement of support pins is within the scope of the present disclosure. Preferably, the areas of contact between the support pins 28 and the wafer 30 are minimal.

The support pins 28 may be fixed relative to the heating stage 24, or they may be extendable therethrough. In embodiments in which the support pins 28 are extendable through the heating stage, the wafer 30 may be elevated or lowered as desired.

In one process of using the system 10, a gas including one or more of Ge, Sb, and Te precursors and optionally one or more co-reactant gases are delivered into the deposition chamber 12 from the source via inlet 16. The wafer 30 is located at a distance of about 5 mm from the heating stage 24 and is, therefore, radiantly heated. Heat radiated from the heating stage 24 also heats the heat shield 14.

During and potentially prior to the deposition of materials, the precursors are activated in an activation region 38 of the deposition chamber 12. The activation region 38 may be heated in any suitable manner to provide the requisite elevated temperature therein. The heating of the activation region may for example be effected by coupling heat from the heated stage to the wall of the chamber, or in other suitable manner effecting conductive, convective or radiative heat transfer for heating of the activation region. Alternatively, the activation region, rather than being in the deposition chamber, could be in an inlet of the deposition chamber, or otherwise outside of the deposition chamber, e.g., in an upstream dedicated activation chamber. When the temperature of the heating stage 24 is about 320 degrees C. to about 400 degrees C., the temperature of the wafer 30 is about 160 degrees C. to about 240 degrees C. Because the heat shield 14 is in close proximity to the heating stage, the temperature of the heat shield 14 in the activation region 38 above wafer 40 has a temperature that is higher than that of the wafer. Preferably, the temperature of the heating stage 24 is maintained such that the temperature of the activation region 38 is about 100 degrees C. higher than that of the wafer 30.

Although the activation region 38 may be located anywhere in the deposition chamber 12 such that the source materials are activated, location of the activation region on the surface of the wafer means that the deposition of GST film is substantially a surface reaction. The present invention is not so limited, however, as there may be a gas phase reaction of source material prior to deposition on the wafer 30. However, any such gas phase reaction should be minimized.

The pressure in the deposition chamber 12 is about 1 Torr to about 10 Torr, and preferably about 2.5 Torr. The present invention is not limited in this regard, however, as other pressures may be maintained in the deposition chamber 12 without departing from the broader aspects of the processes and apparatuses disclosed herein.

As is shown in FIG. 1, by supporting the wafer 30 using the support pins 28, the temperature to which the wafer is subjected is reduced (relative to the heating stage 24). As a result, a composition of GST having a Te content greater than 50% can be achieved by increasing the influx of Te precursors without leading to the formation of crystalline GST films.

In another embodiment, the wafer 30 may be elevated by the support pins 28 and located thereon such that the device side of the wafer faces the heating stage 24. In such an embodiment, the device side of the wafer 30 is heated by thermal radiation to a temperature of about 180 degrees C. to about 240 degrees C. by the heating stage 24, which is at a temperature of about 340 degrees C. to about 420 degrees C. It will be appreciated that the thermal management of the deposition process may be conducted in any suitable manner to effect the deposition of amorphous GST films, within the skill of the art, based on the disclosure hereof.

By activating the precursors in an activation region prior to deposition onto the wafer in the form of a film, some degree of gas phase reaction is affected. However, in the deposition system, the gas phase reaction should be minimized. The final film deposition is preferably the result of a surface reaction that also occurs as the film is deposited onto the wafer. The reaction can be carried out at wafer temperatures as low as 150 degrees C. and activation region temperatures as low as 200 degrees C.

Thus, the systems and processes of the present disclosure can be implemented with activation of one or more precursors in the inlet of the deposition chamber. In other implementations, pre-activation of one or more of the precursors may be carried out in a pre-activation zone that is outside the deposition chamber, e.g., a separate pre-activation chamber that may for example be arranged in series or other flow arrangements with respect to the deposition chamber. Such dedicated pre-activation chamber can in many instances be more closely controlled as to its temperature, in relation to activation heating within the deposition chamber. This in turn may enable precursor activation to be achieved without excessive shift of the process baseline, and with increased capacity to avoid particle generation that may sometimes occur in the heating zone of the deposition chamber if temperature of the heating zone falls below desired operating conditions.

The pre-activation chamber is desirably operated at substantially higher temperature than inside the chamber, in order to minimize susceptibility to particle formation. Pre-activation is typically used for one more precursors that are typically only partially decomposed at high temperature. By selectively activating these high temperature-decomposable precursors, without activating the other precursors that are able to be deposited at lower temperature without the need for pre-activation, highly energy-efficient operation can be attained that is productive of superior film formation on the substrate.

In some systems and processes, the Ge, Sb and Te precursors may be passed into the deposition chamber without pre-activation, but such pre-activation may be employed to make one or more of such precursors more effective in low temperature deposition.

Figure 2:
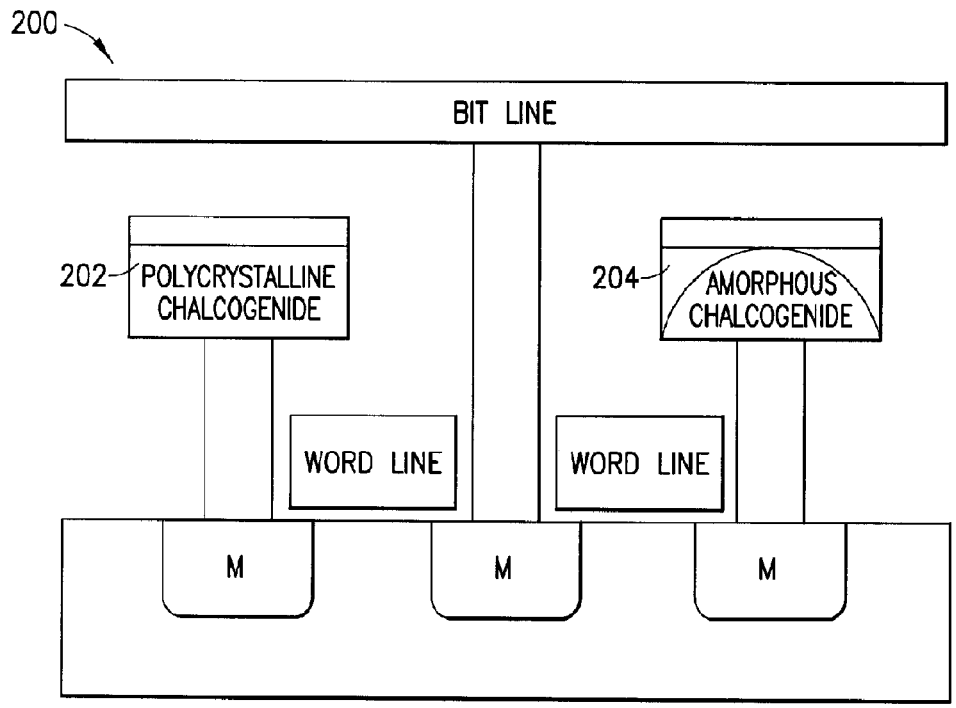
FIG. 2 is a schematic representation of a phase change memory cell device including chalcogenide material of the present disclosure.

FIG. 2 is a schematic representation of a phase change memory cell device 200 including chalcogenide material of the present disclosure as phase change memory elements 202 and 204. The cell device includes bit line and word line elements, and includes phase change memory element 202 in a polycrystalline state, and the phase change memory element 204 in an amorphous state.

It will be appreciated that the phase change material of the present disclosure can be provided in thin film and other conformations, and can be utilized in a variety of microelectronic device applications.

In any embodiment, the precursors are activated together with co-reactants by being heated, thereby providing for increased reactivity in the activation regions. The passage of the precursors and co-reactants along the length of the activation regions partly determines the degree of reactivity of the precursors. The heating element(s) can be located inside the heating stages of the deposition chambers, or they can be located in a showerhead upstream of the substrate, upstream of a showerhead and downstream of an inlet, or even further upstream in an inlet through which the precursors and co-reactants are introduced. Multiple heating sources can be used for achieving uniform thermal activations of precursors.

In addition, it will be appreciated that the chemical species employed to deposit the chalcogenide material may be thermally activated or in other manner energized to generate transitory species for the deposition. By this approach, a chemical species may be transformed into a different chemical form to provide deposition species that for example may be short-lived but are sufficiently present to enable deposition, in the transport from the activation region to the wafer surface. In this manner, the deposition chemical species may be generated in situ for the deposition operation.

With respect to the carbon and nitrogen species that are incorporated in the GST film, it will be recognized that these species may be provided in a bound or non-bound form. For example, the nitrogen may be introduced in free form as nitrogen gas, or alternatively as a nitrogen-containing moiety in a precursor or co-reactant that is introduced to the deposition operation.

From a process aspect, the Ge, Sb, and Te precursor vapors can be used with carbon and nitrogen being incorporated in the GST material in any suitable manner. For example, the carbon source for such carbon incorporation may be an organo moiety of an organometallic precursor used in the formation of the GST material, or a separate carbon source such as methane or other hydrocarbyl gas or moiety. The nitrogen source can likewise be a nitrogen-containing moiety of one or more of the G, S and T precursors, or a separately added source such as ammonia, nitrogen, or other suitable gases. A gas flow rate can be about 20 to about 200 standard cubic centimeter per minute (sccm), particularly for a one inch size substrate (wafer coupon). Gas flow rates are scaled up accordingly for larger size substrates (e.g., 300 mm or 8 inch wafers). Also, ammonium gas at 200 sccm can be diluted to 50 sccm using a hydrogen flow at 150 sccm to decrease the growth rate or to promote conformal fill benefits. Reduced process pressure from 2.5 Torr to lower values (e.g., to about 0.25 Torr) may also improve chemical mass transfer functions and provide for better uniformity and improved conformal deposition. On the other hand, higher pressures at 10 Torr can improve the growth rate due to higher molecular concentrations from the precursors being available. Diluent gases such as Ar, $N_2$, He, and combinations thereof can also be introduced from a bubbler or a ProEvap carrier gas operating system.

In one respect, the nucleation sites present in the film may derive from the presence of carbon as well as nitrogen, and may also be generated as a result of carbon-nitrogen interaction. In general, the more nucleation sites present in the chalcogenide film, the faster nucleation will take place and the more rapid will be the transformation between amorphous and crystalline states in the operation of the GST material. Broadly, the greater the population of nucleation sites, the shorter are the required crystalline lengths involved in the propagation of crystalline transformation, and the quicker the GST device will be in response to a phase change stimulus.

Advantageously, carbon doping may reduce the reset current of the GST film, and nitrogen doping may improve conformality of the film. Carbon doping can reduce the reset current by a factor of 2-3 times.

After the GST film is deposited, the wafer may be subjected to an annealing process to enhance or "finish" film properties. Chemical mechanical polishing can also be carried out on the GST film, as may be desirable in the process flow for fabrication of the product film and corresponding semiconductor devices or precursor device structures.

It will be recognized that the nitrogen content of the deposited material can be reduced by annealing or other post-deposition operations. It will also be recognized that the nitrogen content of the films after annealing is not substantially reduced in relation to the nitrogen content of the as-deposited films. It will be correspondingly appreciated that the content of nitrogen, carbon and other film components is to be understood in the context of the description herein as referring to the film content after annealing and/or other post-deposition processing, unless otherwise expressly stated.

The phase change material of the present disclosure can be provided in thin film and in other forms and conformations, and correspondingly used in a variety of microelectronic device applications.

Precursors of any suitable types may be employed in forming the GST material of the present disclosure.

Figure 3:
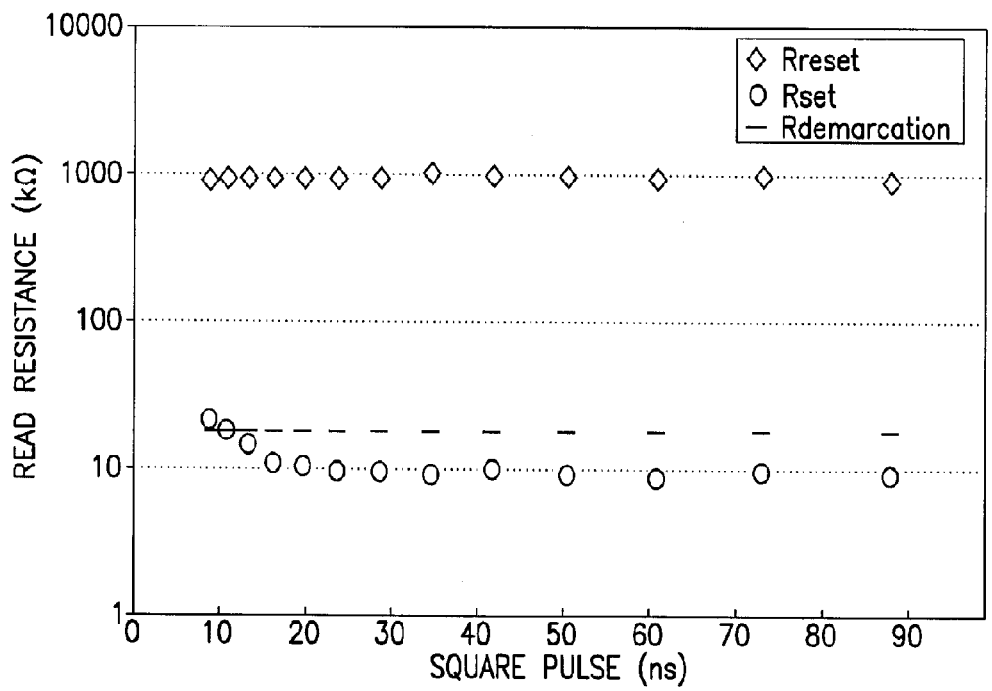
FIG. 3 is a graph of set speed measurement data in a plot of read resistance in kilo-ohms (kΩ), as a function of square pulse widths, at a reset pulse amplitude of 2.1 milliAmps (120% Irs, sat) and set pulse amplitude of 0.90 milliAmps, for $R_{reset}$ (◇) $R_{set}$ (○) and $R_{demarcation}$ (—).
Figure 4:
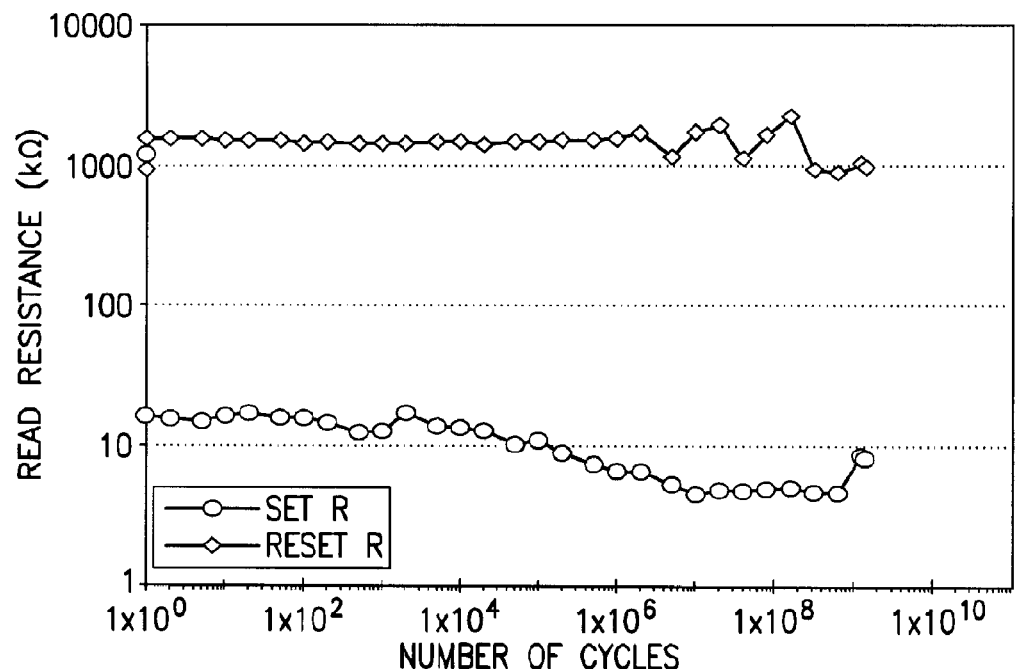
FIG. 4 is a graph of parameters Set R (○) and Reset R (◇) during cycles.

Compositions of the disclosure can be used to fill deep pore structures in a void-free manner by MOCVD techniques, e.g., in pores having a 3:1 or higher aspect ratio (of pore height to pore diameter) with pore heights on the order of 70 to 100 nm, with performance of resulting device structures being exemplified by the data shown in the graphs of FIGS. 3 and 4.

FIG. 3 is a graph of set speed measurement data in a plot of read resistance in kilo-ohms (kΩ), as a function of square pulse widths, at a reset pulse amplitude of 2.1 milliAmps (120% Irs, sat) and set pulse amplitude of 0.90 milliAmps, for $R_{reset}$ (◇), $R_{set}$ (○) and $R_{demarcation}$ (—).

FIG. 4 is a graph of parameters Set R (○) and Reset R (◇) during cycles.

The data shown in FIGS. 3 and 4 were generated by a phase change memory device according to the present disclosure, including a germanium-antimony-tellurium (GST) alloy memory element with the atomic composition of Ge 36%, Sb 13% and Te 51%, based on the total of germanium, antimony and tellurium in the compostion, having a set speed of 12 nanoseconds and cycle endurance of 1E9 without failure.

Figure 5:
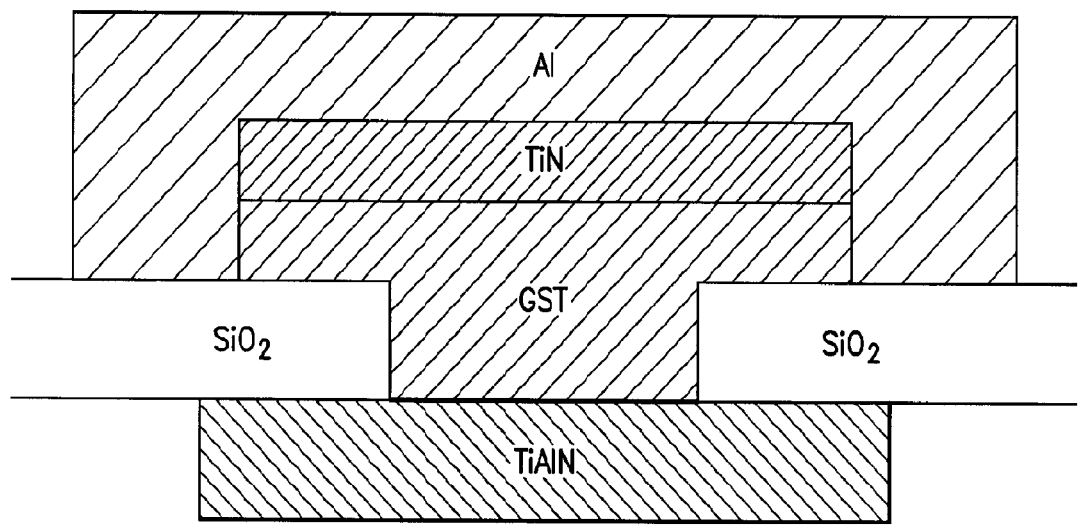
FIG. 5 is a schematic representation of a PCM GST device structure according to one embodiment of the present disclosure.

FIG. 5 is a schematic representation of a PCM GST device structure according to one embodiment of the present disclosure. In this structure, a GST alloy was deposited by metalorganic chemical vapor deposition (MOCVD) at a thickness in a range of 70 nanometers (nm) to 100 nm in a pore having a depth on the order of 50 nm. The pore was formed by etching of the $SiO_2$ with the TiAlN layer constituting an etch stop layer. TiN then was deposited over the GST alloy, followed by patterning and etching of the TiN and GST to form an isolated PCM device. Aluminum was deposited over the PCM structure and then pattern etched again to form an isolated Al pad over the TiN/GST stack. The Al pad is larger in the extent of its area than the TiN/GST stack, and thus part of the aluminum overlayer adheres to the $SiO_2$ layer to improve the seal of the sidewall of the GST and afford protection of the GST element in the PCM device structure.

Devices of the present disclosure having set speed of for example below 15 nanoseconds can be fabricated with carbon and nitrogen doping (e.g., at 3-15 at % carbon and 1-15 at % nitrogen) and post-fabrication annealing in a nitrogen or other suitable ambient, such as argon, helium, or other inert atmosphere, for an extended period of time, e.g., 10 to 40 hours at temperature in a range of from 300 to 475° C.

Devices of superior set speed characteristics (set speed<20 ns, preferably <15 ns and more preferably <12 ns) can be variously fabricated using MOCVD alloy compositions of the present disclosure containing 40-50% or more tellurium. Such alloys can be utilized in low aspect ratio fill structures, to provide endurance of $10^8$ to $10^9$ cycles or even higher cycles values, and 10 year retention greater than 70° C., in phase change memory cell structures.

Preferred alloys for such purpose include GST 225 (containing 22.5% germanium, 22.5% antimony and 55% tellurium), GST 325 and similar alloys (e.g., containing from 27.5 to 32.5% germanium, with tellurium being as high as 55%, or between 50 and 55%, and with the remainder being antimony) and GST 415 alloy containing 40% germanium, 10% antimony and 50% tellurium.

Using alloy compositions of the above types, phase change memory cell structures can be formed in various embodiments, in low aspect ratio (>1:1) vias, with set speeds below 20 ns, endurance of at least $10^9$ cycles and 10-year retention greater than 70° C. In other embodiments, phase change memory cells can be fabricated with set speeed below 20 ns, and endurance of at least $10^9$ cycles. In still other embodiments, phase change memory cells can be fabricated, having 10-year retention greater than 70° C. and set speed in a range of from 12 to 18 ns.

Devices of such types may have a CD range of 88-106 nm as measured by scanning electron microscope, in specific embodiments, with speed being independent of device size.

Phase change memory devices fabricated using the above alloy compositions have excellent 10 year data retention characteristics. For example, an MOCVD GST 36-14-50 alloy has been demonstrated by the present inventor to provide phase change memory device structures with 10 year data retention of 74° C., an MOCVD GST 325 alloy has been demonstrated to provide phase change memory device structures with 10 year data retention of 102° C., and MOCVD GST 415 has been demonstrated to provide phase change memory device structures with 10 year data retention of 118° C.

Figure 6:
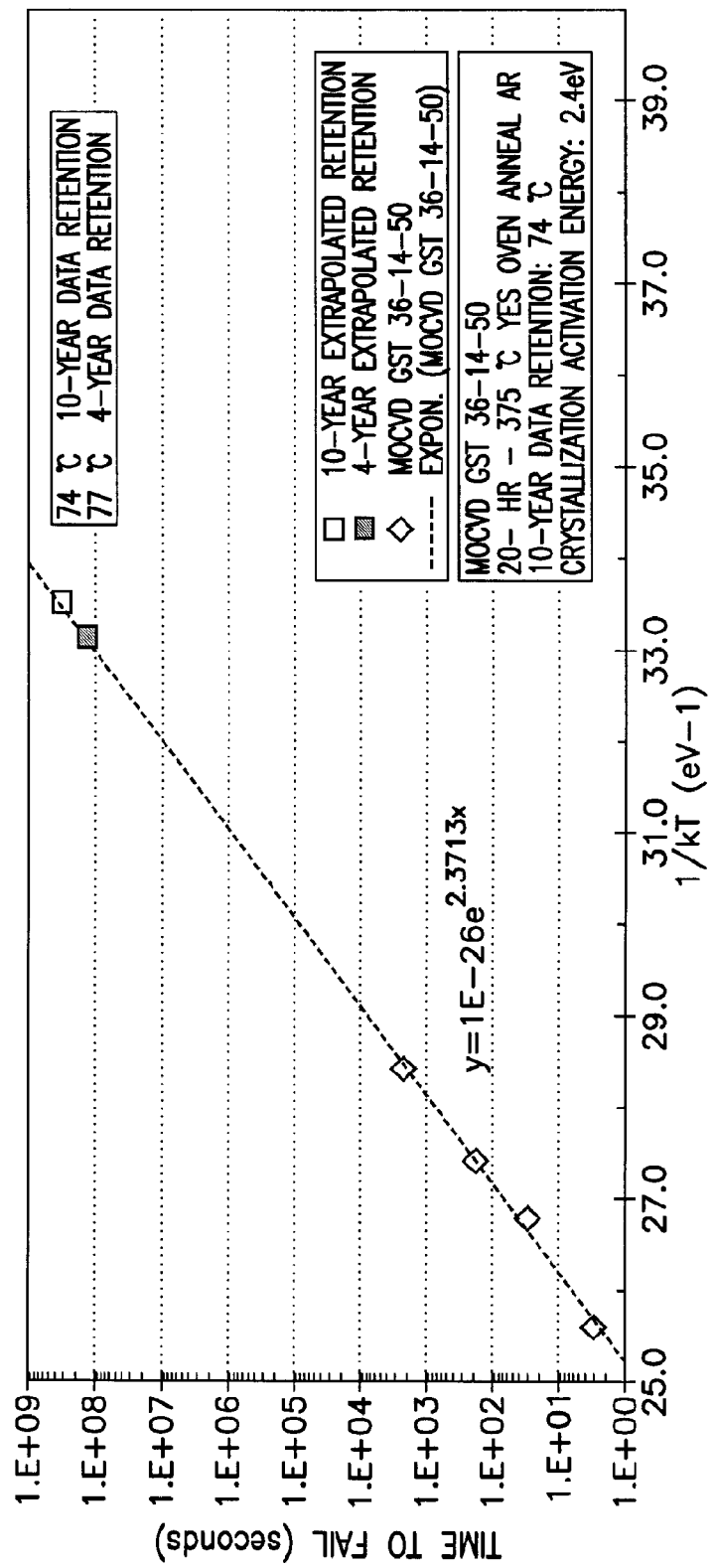

By way of specific example, FIG. 6 is a data retention plot, with time to fail, in seconds, as a function of $1/kT(eV-1)$ for an MOCVD GST alloy composition containing 36% germanium, 14% antimony and 50% tellurium subjected to 20 hour annealing in argon at 375° C., showing 4 year and 10 year data retention of 77° C. and 74° C., respectively.

Figure 7:
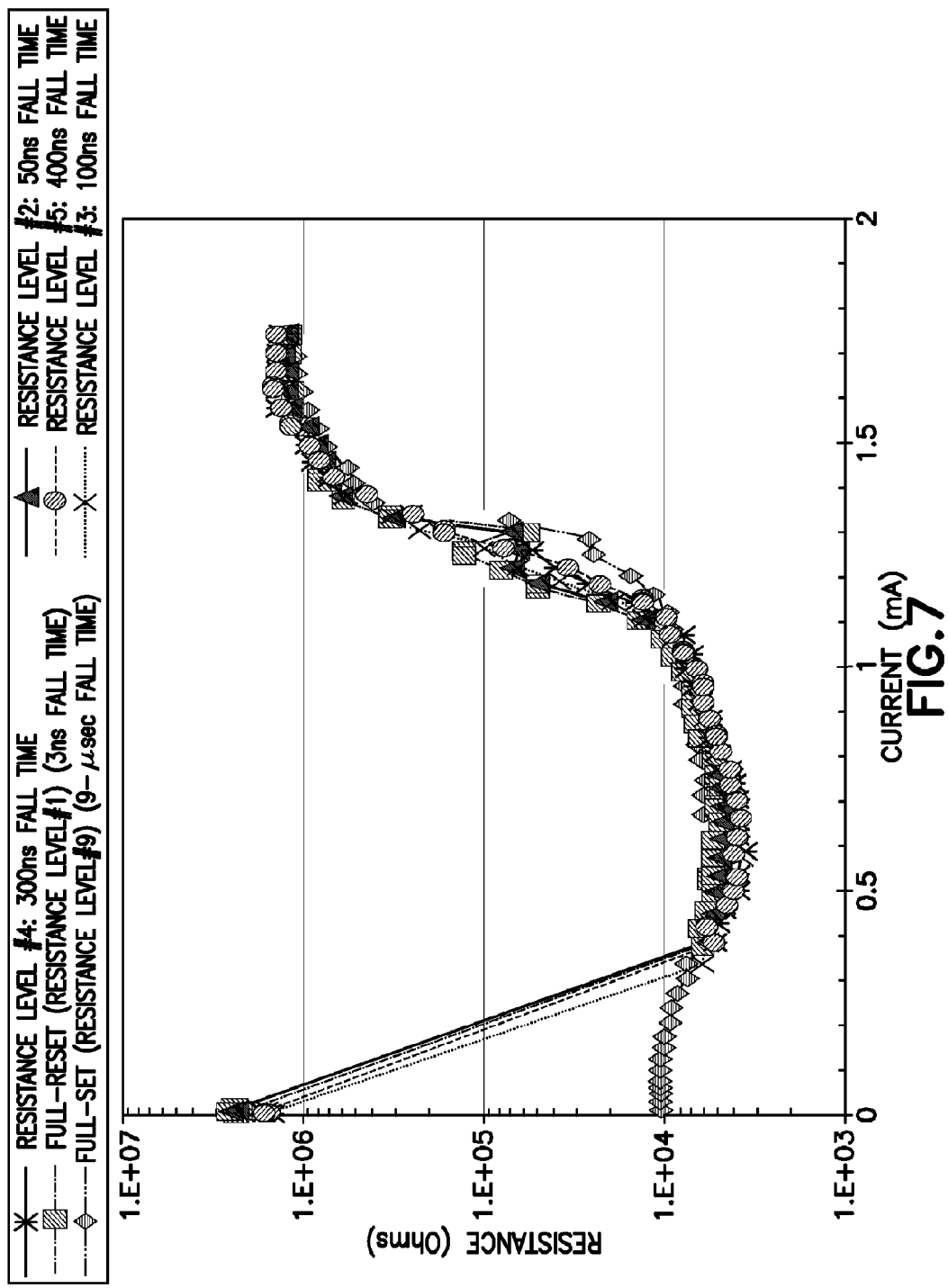
Figure 8:
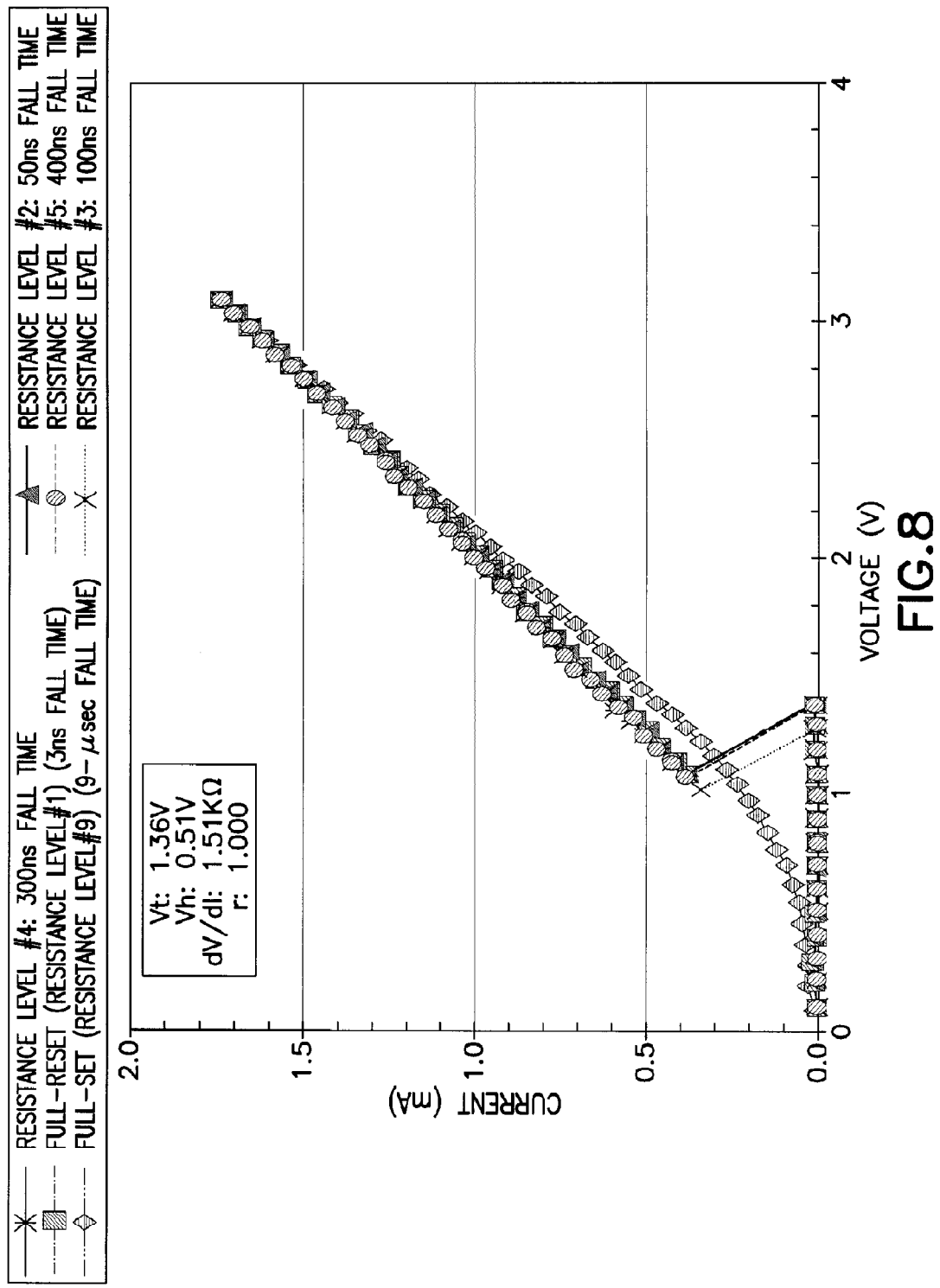
Figure 9:
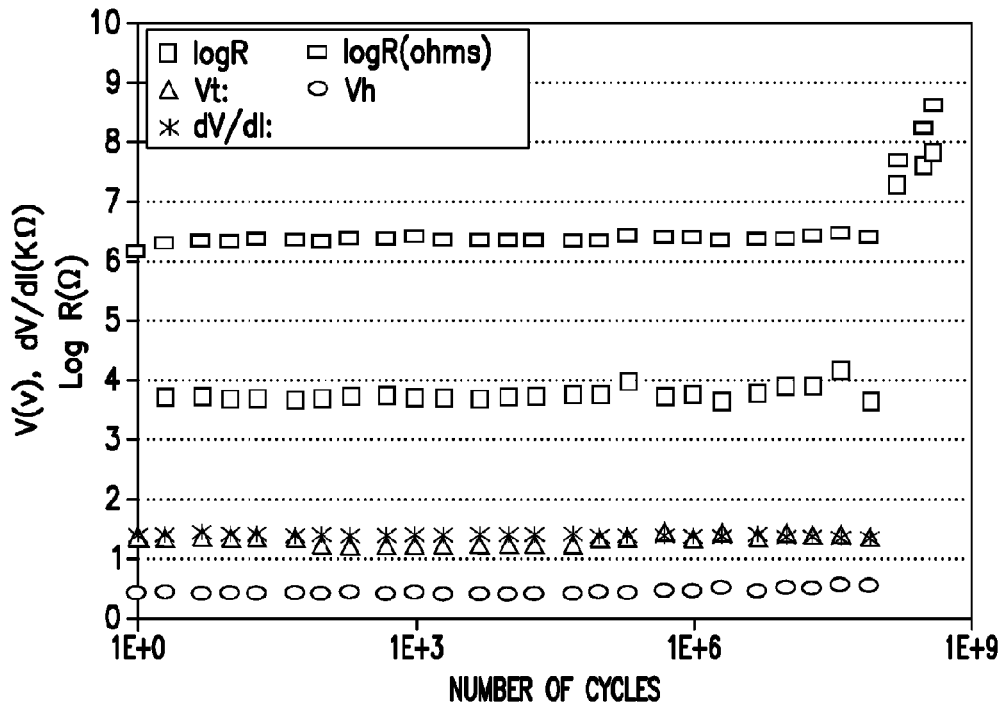
Figure 10:
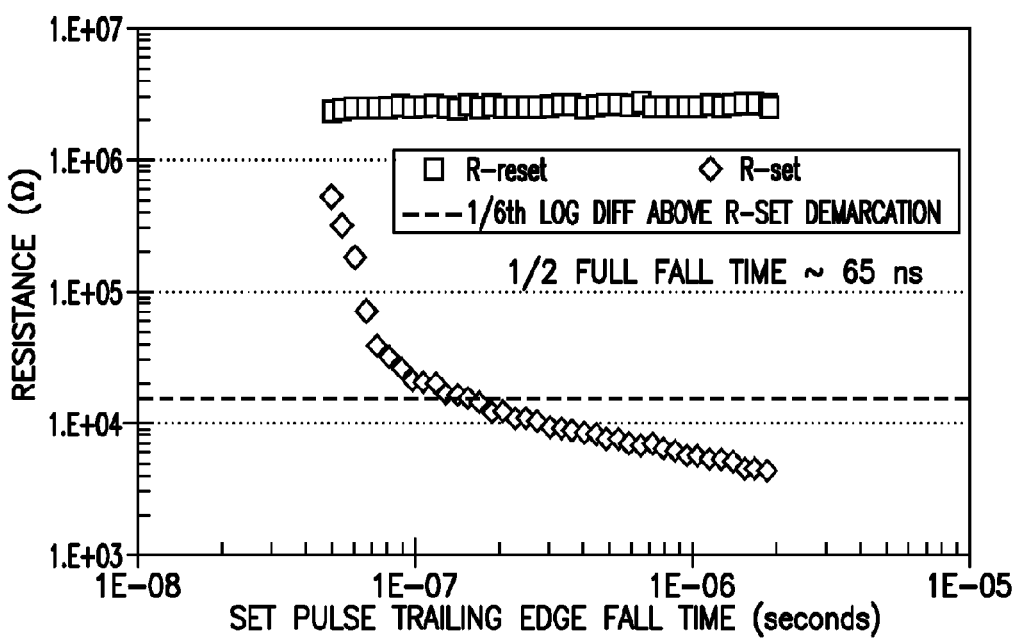
Figure 11:
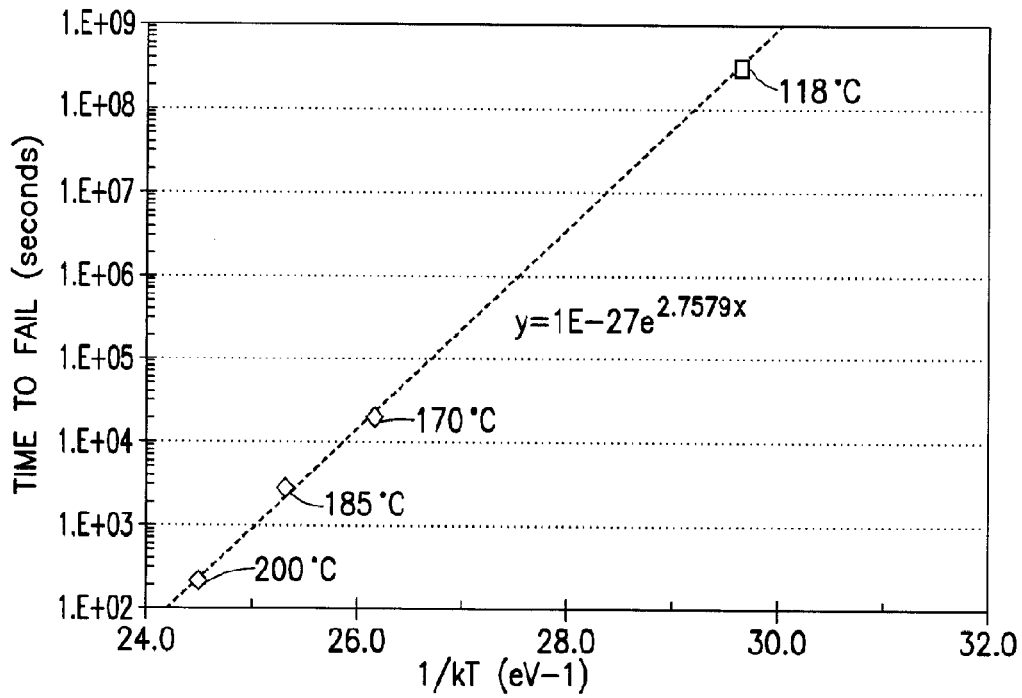
Figure 12:
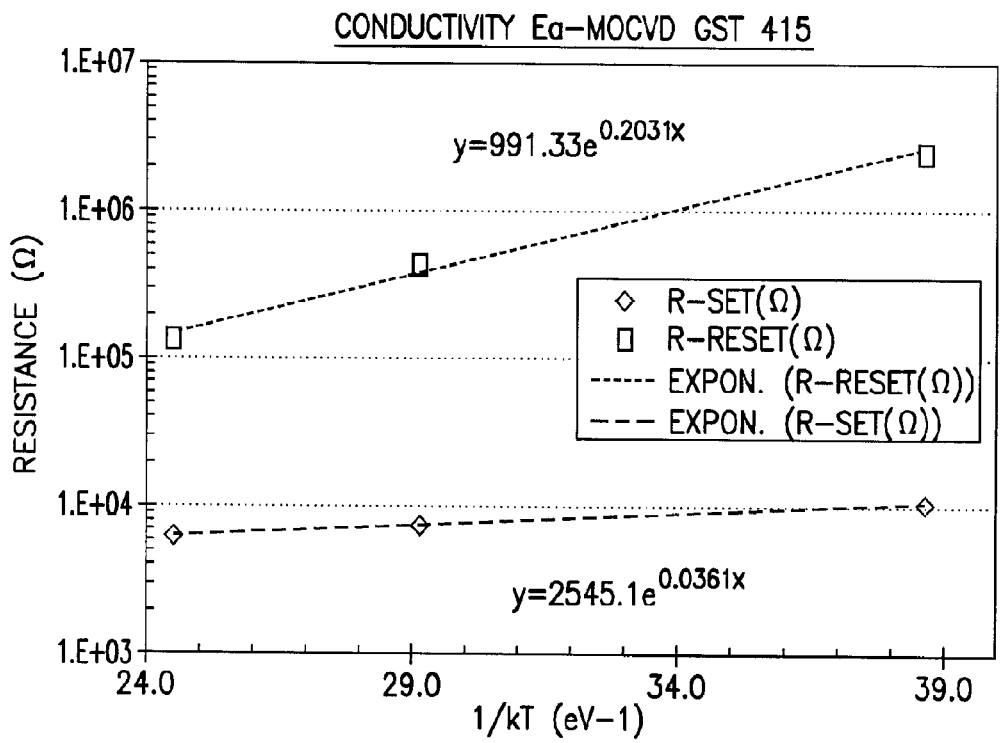

As further examples of the performance characteristics of MOCVD alloy compositions of the present disclosure, FIGS. 7-12 are data plots for an MOCVD GST 415 alloy composition containing 40% germanium, 10% antimony and 50% tellurium, wherein FIG. 7 is a plot of resistance in ohms, as a function of current, in milliamps, FIG. 8 is a plot of current, in milliamps, as a function of voltage, FIG. 9 is a plot of V(v), dV/dI (Kohms), and Log R (ohms), as a function of number of cycles, FIG. 10 is a plot of resistance, in ohms, as a function of Saturated Pulse Trailing Edge Fall Time, in seconds, in which the fall time is the set speed, FIG. 11 is a plot of time to fail, in seconds, as a function of $1/kT(eV-1)$, and FIG. 12 is a plot of resistance, in ohms, as a function of $1/kT(eV-1)$.

Figure 13:
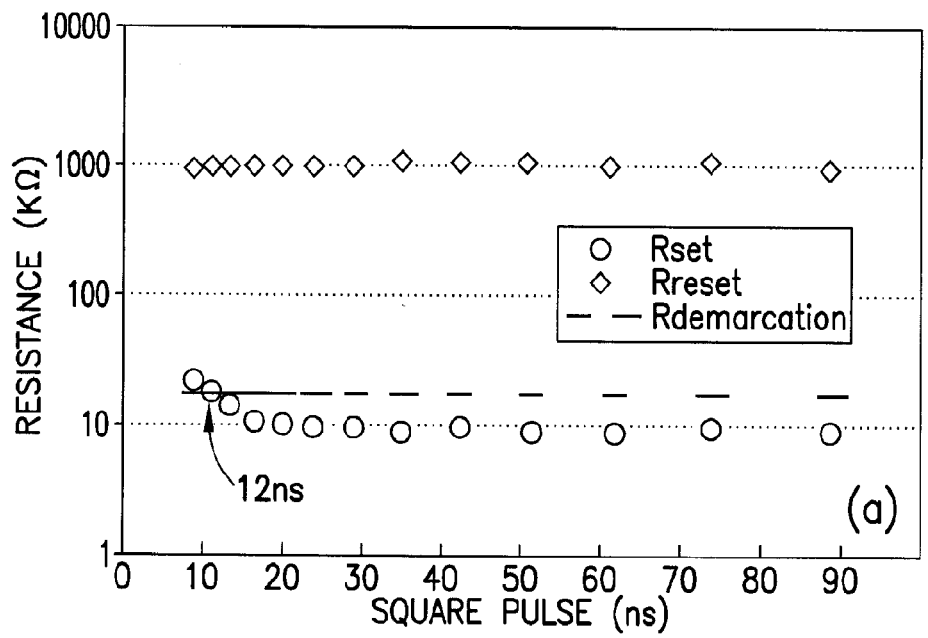
FIG. 13-16 is a set of data for a fast 12-14 ns speed device of the composition Ge 36%, Sb 14% and Te 50%.
Figure 14:
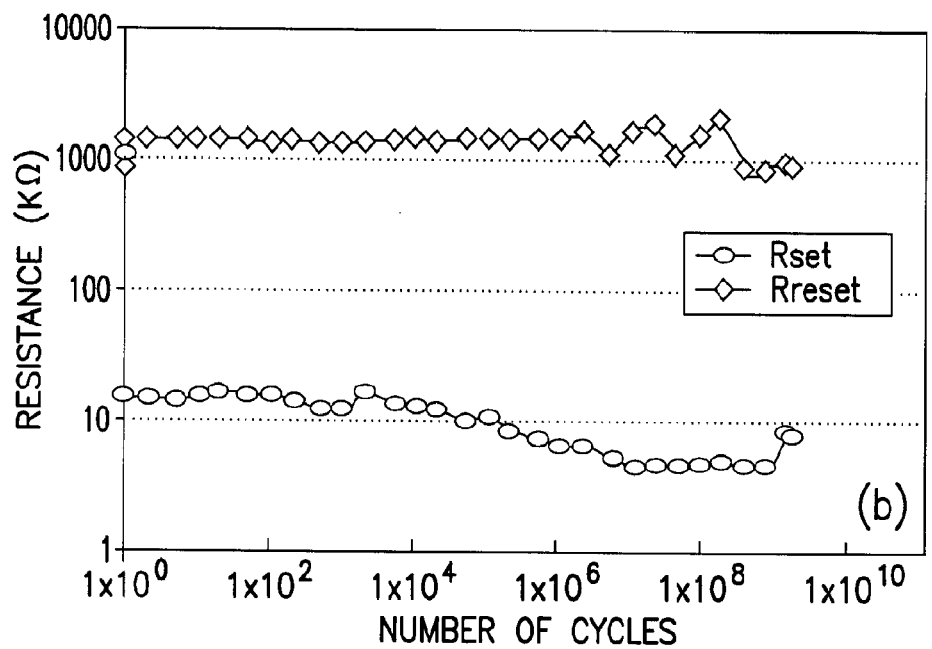
Figure 15:
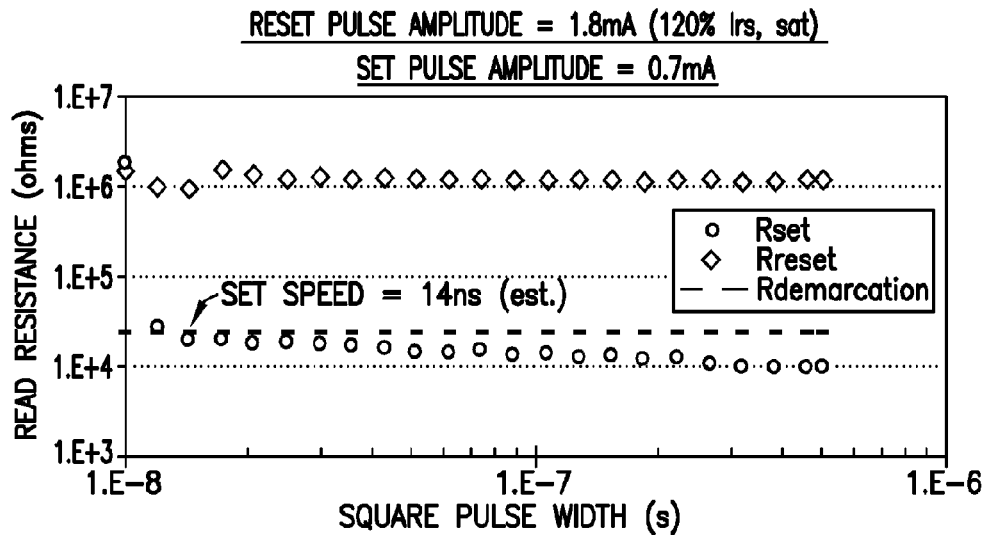
Figure 16:
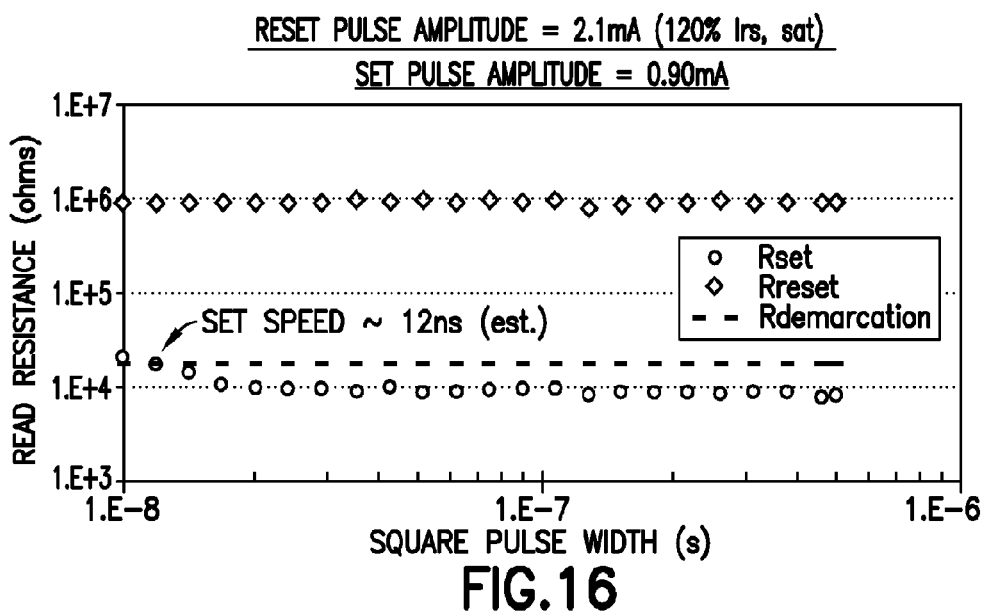

FIG. 13-16 is a set of data for a fast 12-14 ns speed device of the composition Ge 36%, Sb 14% and Te 50%. FIG. 13 is a plot of resistance, in kiloohms, as a function of square pulse, in nanoseconds, for set resistance ($R_{set}$) demarcation resistance ($R_{demarcation}$) and reset resistance ($R_{reset}$), FIG. 14 is a plot of resistance, in kiloohms, as a function of number of cycles for set resistance ($R_{set}$) and reset resistance ($R_{reset}$), FIG. 15 is a plot of read resistance, in ohms, as a function of square pulse width, in seconds, and FIG. 16 is a plot of read resistance, in ohms, as a function of square pulse width, in seconds.

Figure 17:
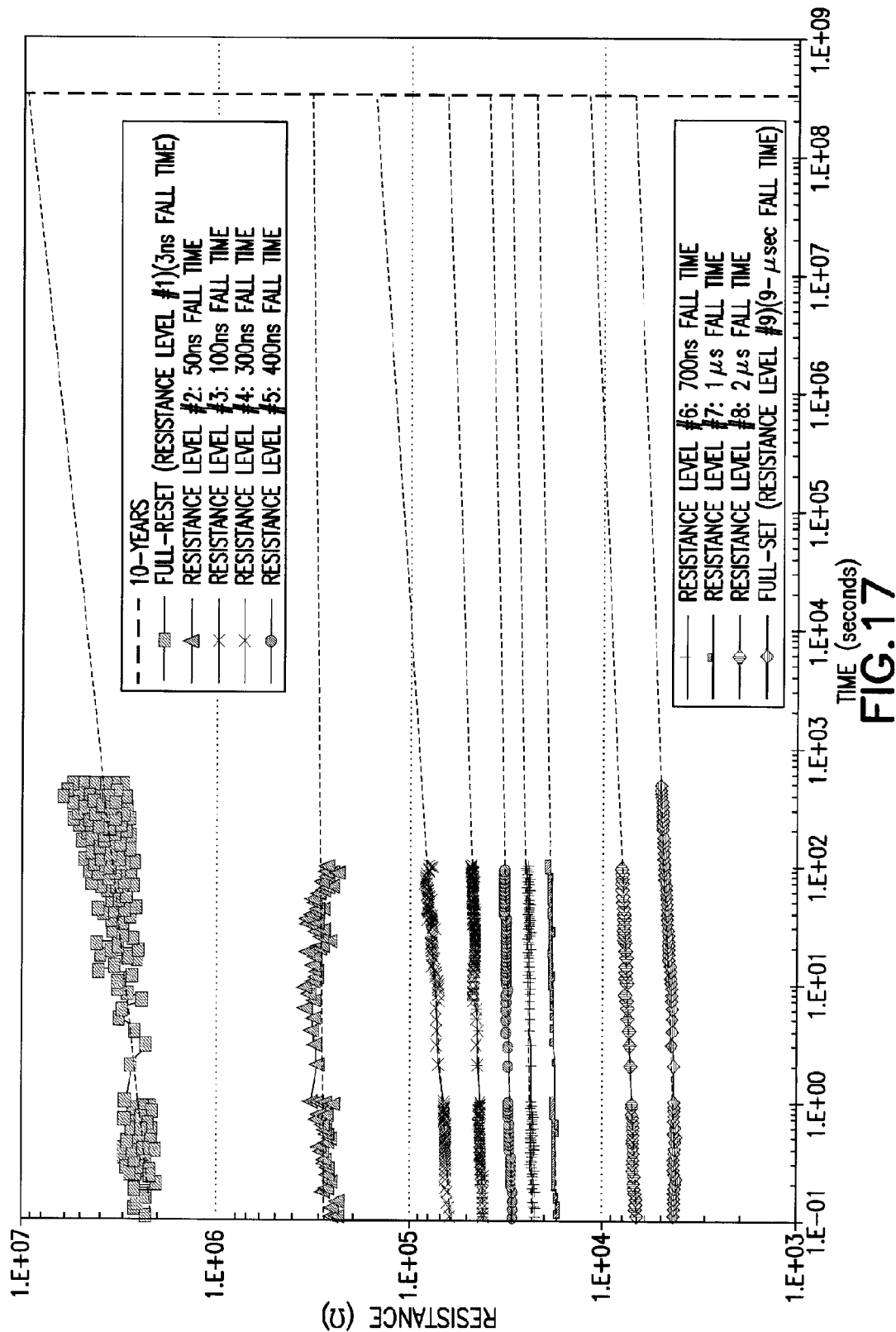
FIG. 17 is a set of data for an alloy tuned to provide multi-level reset resistance for multi-level phase change device application. It is a plot of resistance, in ohms, as a function of time, in seconds, for varied resistance levels.

FIG. 17 is a set of data for an alloy tuned to provide multi-level reset resistance for multi-level phase change device applications. It is a plot of resistance, in ohms, as a function of time, in seconds, for varied resistance levels. This graph shows resistance data including 10-year extrapolated values, and data for full-reset (resistance level #1) (3 nanoseconds fall time), resistance level #2 (50 nanoseconds fall time), resistance level #3 (100 nanoseconds fall time), resistance level #4 (300 nanoseconds fall time), resistance level #5 (400 nanoseconds fall time), resistance level #6 (700 nanoseconds fall time), resistance level #7 (1 microsecond fall time), resistance level #8 (2 microseconds fall time), and full set resistance level #9 (9 microsecond fall time) for the GST alloy.

Phase change memory devices with MOCVD GST 325 alloys achieve high levels of reduction (e.g., 2× reduction) in reset current compared to devices with PVD GST alloys, while concurrently achieving higher dynamic resistance and better heating efficiency. Such enhanced characteristics are due to the intrinsic properties of the MOCVD GST alloy compositions. Set out below is a tabulation of empirically determined parameter values for GST phase change memory materials deposited by PVD using GST 225 alloy, by MOCVD using GST 325 alloy, and by MOCVD using GST 415 alloy.

| Comparison of MOCVD GST and PVD GST | | | |
| --- | --- | --- | --- |
| Parameters | PVD GST 225 | MOCVD GST 325 | MOCVD GST 415 |
| Void free fill at aspect ratio | <1:1 | >3:1 down to 35 nm | >3:1 down to 35 nm |
| Irst @ 100 nm | 1.4 mA | 0.4-0.6 mA | 1.5 mA |
| 10 Year Retention, | 105° C. | 102° C. | 118° C. |
| crystallization Ea | — | 2.2 eV | 2.8 eV |
| Set speed | 200 ns | 260 ns | 65 ns |
| Cycle Endurance | >1 × 109 | >7 × 109 | ~ 1 × 109 |
| Drift coefficient | 0.1 | 0.1 | 0.1 |

PCM devices made from 325 MOCVD alloy demonstrated 2-3× less reset current as compared with that from a PVD alloy in 100 nm shallow pore devices. The reset current reduction derives from intrinsic properties of the 325 MOCVD GST alloy.

PCM devices made from 415 MOCVD alloy show 3× faster set speed than PVD GST 225 alloy and 20° C. higher 10 year data retention.

In 100 nm device structures, MOCVD compositions achieved 12 ns set speed and cycle endurance of $10^9$, suitable for providing superior performance in fast PCM device applications such as dynamic random access memory. Device speed is independent of device size and reset current reduction can be further achieved by size scaling.

Thus, the present disclosure contemplates a phase change memory cell including a GST material having a set speed below 20 ns, and endurance of $10^9$ cycles or more.

Such phase change memory cell in one embodiment has a set speed in a range of from 12 to 18 ns. In other embodiments, the phase change memory cell has a set speed at least as low as 12 ns. Other phase change memory cell embodiments have a 10-year retention greater than 70° C. Phase change memory cells are contemplated in other embodiments having a 10-year retention greater than 70° C. and a set speed in a range of from 12 to 18 ns.

In other embodiments, the phase change memory cell includes a GST material selected from the group consisting of 225 GST alloy, 325 GST alloy, and 415 GST alloy. Such GST material in further embodiments further comprise at least one of carbon and nitrogen.

Further embodiments of the disclosure variously include: phase change memory cells wherein the GST material has been deposited by MOCVD; phase change memory cells wherein the GST material comprises 415 GST alloy; phase change memory cells having a 10-year retention greater than 100° C.; phase change memory cells having a 10-year retention greater than 110° C.; and DRAM devices including the phase change memory cell of according to any of the above-described embodiments.

The present disclosure therefore reflects a large process space in which smooth and conformal GST materials having >50% Te are achieved by MOCVD, including GST 325 and GST 415.

In MOCVD applications of GST 325, low aspect ratio (1:1) structures remain void free in the phase change memory device after $7 \times 10^9$ cycles and high aspect ratio (3:1) structures exhibit void-free fill of holes.

Low oxygen GST films are achieved by alloys of the present disclosure, in which bulk average concentration of oxygen in the film is lower than 1%.

Compositional variations in the MOCVD-deposited GST films of the present disclosure are low, being in an illustrative film formation process, on a run-to-run basis, about 1.12% for Ge variation, about 0.75% for Sb variation, and about 0.38% for Te variation. Thickness variation of MOCVD-deposited films of GST alloys of the present disclosure is also low, illustratively varying about 3.87% in a representative 398.6 Angstrom (mean thickness) film.

Figure 18:
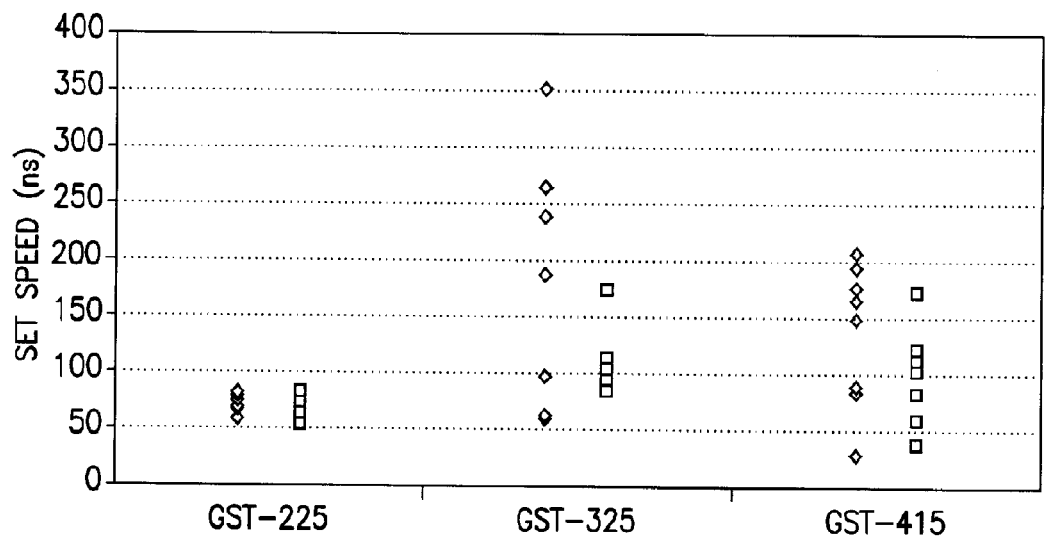
FIG. 18 is a graph of set speed, in nanoseconds, for GST-225, GST-325, and GST-415 germanium-antimony-tellurium alloys.

FIG. 18 is a graph of set speed, in nanoseconds, for GST-225, GST-325, and GST-415 germanium-antimony-tellurium alloys, showing their relative performance. In each of the graph segments, the data on the left-hand of the panel for each alloy is for 45 minutes anneal and the data on the right-hand side of the panel for each alloy is for 24 hour annealing. These data are tabulated in the table below.

| Set speeds of 225, 325 and 415 GST alloys depending on their anneal times | | | |
| --- | --- | --- | --- |
| Composition | 225 | 325 | 415 |
| 45 min annealing | 75.4 +/− 7.8 ns | 182.4 +/− 111.7 ns | 138.3 +/− 62.7 ns |
| 24 hr annealing | 65.6 +/− 9.5 ns | 111.7 +/− 29.6 ns | 99.6 +/− 43.8 ns |

Annealing can typically be carried out at temperature in a range of from 300° C. to 400° C. in an inert gas ambient atmosphere, for a period of time that is sufficient to achieve the desired enhancement of performance from the GST material. Typically, the period of annealing can be in the range of from 30 minutes to 24 hours or more. There is a "time× temperature" aspect in the improvement of film performance as a result of annealing, with longer anneal times generally enabling lower temperature annealing to be carried out, and with shorter anneal times generally requiring higher anneal temperatures to achieve a corresponding film performance benefit.

In general, GST materials of the present disclosure are benefitted by doping with carbon, nitrogen, and/or oxygen, since doping provides extensive nucleation sites that provide various benefits. With such doping, it is easier to form crystalline nucleation sites that enhance speed for the nucleation-limited growth, and the denser distribution of added nucleation sites shortens the necessary distance for crystalline growth. Device speed is normally limited by either nucleation (which is less device size-limited) or growth of crystalline material from a nuclear size (thus, device size-dependent).

Figure 19:
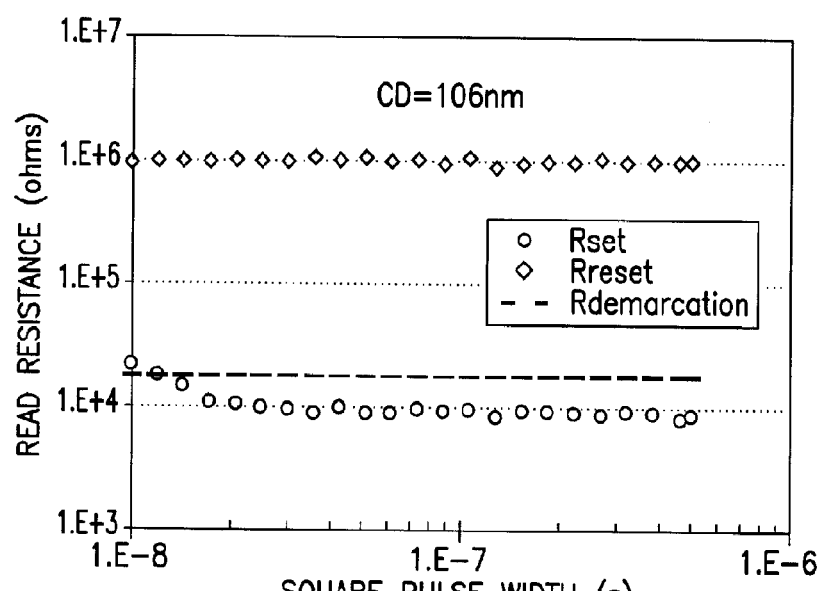
FIG. 19 is a graph of read resistance, in ohms, as a function of square pulse width, in seconds, for a GST alloy having a composition of 36 at % germanium, 14 at % antimony, and 50 at % tellurium.

FIG. 19 is a graph of read resistance, in ohms, as a function of square pulse width, in seconds, for a GST alloy having a composition of 36 at % germanium, 14 at % antimony, and 50 at % tellurium. This alloy is intermediate 325 and 415 GST alloys, and was annealed for 24 hours in argon at 375° C. It exhibits a reset speed of 12 nanoseconds.

The present disclosure thus contemplates GST materials whose set speed is substantially enhanced by annealing, to provide GST phase change memory materials characterized by a set speed of less than 15 nanoseconds. Device structures can be of any suitable type, e.g., TiAlN/SiO2/GST/TiN/Al device structures.

Although the invention has been shown and described with respect to detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention not be limited to the particular embodiments disclosed in the above detailed description, but that the invention will include all embodiments falling within the scope of the appended claims.

What is claimed is:

1. A chalcogenide alloy composition, having an atomic composition comprising from 34 to 45% Ge, from 2 to 16% Sb, from 48 to 55% Te, from 3 to 15% carbon and from 1 to 10% nitrogen, wherein all atomic percentages of all components of the alloy composition total to 100 atomic %.

2. The alloy composition of claim 1, having a set speed of less than 20 nanoseconds.

3. The alloy composition of claim 1, having a cycle endurance greater than $1 \times 10^8$.

4. The alloy composition of claim 1, wherein said atomic composition of germanium, antimony and tellurium comprises 36% Ge, 14% Sb, and 50% Te, doped with from 8 to 12 at. % carbon and doped with from 1 to 10 at. % nitrogen, wherein dopant atomic percentages are based on total atomic percentages of all components of the alloy composition including dopants.

5. The alloy composition of claim 1, in a phase change memory device comprising a phase change random access memory cell.

6. The alloy composition of claim 1, wherein said atomic composition comprises 36 at % Ge, 13 at % Sb, and 51 at % Te, based on total atomic weight of Ge, Sb and Te in the composition, and doped with from 3 to 15 at % carbon and from 1 to 10 at % nitrogen, wherein atomic percentages of carbon and nitrogen are based on total atomic weight of Ge, Sb, Te, C and N in the composition.

7. The alloy composition of claim 6, having a set speed of less than 20 nanoseconds.

8. The alloy composition of claim 6, having a cycle endurance greater than $1 \times 10^9$.

9. The chalcogenide alloy composition of claim 1, in a phase change memory cell wherein the chalcogenide alloy composition has a set speed below 20 ns, and endurance of $10^9$ cycles or more.

10. The chalcogenide alloy composition of claim 9, having a set speed in a range of from 12 to 18 ns.

11. The chalcogenide alloy composition of claim 9, having a 10-year retention greater than 70° C. and a set speed in a range of from 12 to 18 ns.

12. The chalcogenide alloy composition of claim 1, wherein a Ge:Sb:Te ratio is 4:1:5 in the chalcogenide alloy composition which is formed by metalorganic chemical vapor deposition (MOCVD), having a set speed of less than 70 ns.

13. The chalcogenide alloy composition of claim 1, comprising 36% Ge, 14% Sb, and 50% Te, with C and N doping, exhibiting a multi-level resistance level that is sustainable for at least 10 years without interference of resistance values thereof.

14. A method of enhancing set speed of a chalcogenide alloy composition for use in a phase change memory device, said method comprising annealing said chalcogenide alloy composition in an inert atmosphere for 10 to 40 hours at temperature in a range of from 300 to 475° C.,
wherein said chalcogenide alloy composition has an atomic composition comprising from 34 to 45% Ge, from 2 to 16% Sb, and from 48 to 55% Te, based on total atomic weights of Ge, Sb and Te in the chalcogenide alloy composition, and doped with from 3 to 15% carbon and from 1 to 10% nitrogen, wherein atomic percentages of carbon and nitrogen are based on total atomic weight of Ge, Sb, Te, C and N in the composition.

15. The method of claim 14, wherein the inert atmosphere comprises a nitrogen atmosphere.

16. The method of claim 14, wherein the chalcogenide alloy composition is in a phase change random access memory cell of the phase change memory device.

17. The method of claim 14, wherein the chalcogenide alloy composition has an atomic composition comprising 36 at % Ge, 13 at % Sb, and 51 at % Te, based on total atomic weight of Ge, Sb and Te in the composition, and doped with from 3 to 15 at % carbon and from 1 to 10 at % nitrogen, wherein atomic percentages of carbon and nitrogen are based on total atomic weight of Ge, Sb, Te, C and N in the composition.

18. A phase change memory (PCM) GeSbTe (GST) device structure comprising a TiAlN layer with an $SiO_2$ layer thereon, wherein the $SiO_2$ layer has a pore therein bounded at a lower end thereof by the TiAlN layer, a GST alloy composition filling the pore and in a layer above the pore that extends laterally outwardly to overlie the $SiO_2$ layer surrounding the pore, a layer of TiN overlying the GST alloy layer and generally coextensive therewith, and an encapsulating layer consisting of aluminum overlying the layer of TiN and extending laterally beyond the TiN layer and downwardly at an outer lateral periphery to the $SiO_2$ layer, thereby encapsulating the GST alloy composition and TiN layer, wherein the GST alloy composition comprises a chalcogenide alloy composition according to claim 1.

19. A method of fabricating a phase change memory (PCM) GeSbTe (GST) device structure, comprising:
providing a substrate including an $SiO_2$ layer thereon, wherein the $SiO_2$ layer has a pore therein bounded at a lower end thereof by a TiAlN layer;
depositing a GST alloy composition in and over the pore and $SiO_2$ layer surrounding the pore;
depositing a layer of TiN over the deposited GST alloy composition to form a TiN/GST alloy composition stack structure;
patterning and etching of the TiN/GST alloy composition stack structure to form an isolated PCM device structure;
depositing an encapsulating material consisting of aluminum over the PCM device structure; and
patterning and etching the deposited aluminum to form an isolated aluminum pad in contact at its outer periphery with the $SiO_2$ layer, to encapsulate the PCM device structure, wherein the GST alloy composition comprises a chalcogenide alloy composition according to claim 1.

20. The method of claim 19, wherein the GST alloy composition is deposited in and over the pore and $SiO_2$ layer surrounding the pore by a deposition process comprising metalorganic chemical vapor deposition.

* * * * *